(12) United States Patent
Marakhtanov et al.

(10) Patent No.: US 12,308,211 B2
(45) Date of Patent: May 20, 2025

(54) SYSTEMS AND METHODS FOR USE OF LOW FREQUENCY HARMONICS IN BIAS RADIOFREQUENCY SUPPLY TO CONTROL UNIFORMITY OF PLASMA PROCESS RESULTS ACROSS SUBSTRATE

(71) Applicant: Lam Research Corporation, Fremont, CA (US)

(72) Inventors: Alexei Marakhtanov, Albany, CA (US); Felix Leib Kozakevich, Sunnyvale, CA (US); Ranadeep Bhowmick, San Jose, CA (US); John Holland, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 174 days.

(21) Appl. No.: 18/010,900

(22) PCT Filed: Jun. 23, 2021

(86) PCT No.: PCT/US2021/038647
§ 371 (c)(1),
(2) Date: Dec. 16, 2022

(87) PCT Pub. No.: WO2021/262827
PCT Pub. Date: Dec. 30, 2021

(65) Prior Publication Data
US 2023/0317414 A1  Oct. 5, 2023

Related U.S. Application Data

(60) Provisional application No. 63/044,827, filed on Jun. 26, 2020.

(51) Int. Cl.
*H01J 37/00* (2006.01)
*H01J 37/32* (2006.01)

(52) U.S. Cl.
CPC .. *H01J 37/32183* (2013.01); *H01J 37/32165* (2013.01); *H01J 2237/334* (2013.01)

(58) Field of Classification Search
CPC ........... H01J 37/32183; H01J 37/32165; H01J 37/32174; H01J 37/32706
See application file for complete search history.

(56) References Cited

U.S. PATENT DOCUMENTS

| 2009/0315596 A1 | 12/2009 | Leming et al. |
| 2017/0330744 A1 | 11/2017 | Keil et al. |

(Continued)

FOREIGN PATENT DOCUMENTS

| JP | 2013125729 A | 6/2013 |
| WO | 2018160554 A1 | 9/2018 |

OTHER PUBLICATIONS

PCT/US2021/038647, International Search Report and Written Opinion, mailed on Oct. 15, 2021.

*Primary Examiner* — Tuan T Lam
(74) *Attorney, Agent, or Firm* — Penilla IP, APC

(57) ABSTRACT

First, second, third, and fourth radiofrequency (RF) signal generators generate first, second, third, and fourth RF signals, respectively, having first, second, third, and fourth frequencies, respectively. The second and third frequencies are different specified harmonics of the first frequency. The fourth frequency is at least two orders of magnitude larger than the first frequency. An impedance matching system controls impedances for the first, second, third, and fourth RF signal generators. A control module is programmed to control: A) a first phase difference between the first and second RF signals, B) a second phase difference between the first and third RF signals, C) a first voltage difference between the first and second RF signals, D) a second voltage difference between the first and third RF signals. The first and second phase differences and the first and second (Continued)

voltage differences collectively control a plasma sheath voltage as a function of time.

28 Claims, 16 Drawing Sheets

(56) References Cited

U.S. PATENT DOCUMENTS

| | | |
|---|---|---|
| 2019/0318913 A1 | 10/2019 | Yoshida et al. |
| 2023/0282448 A1* | 9/2023 | Shoeb ............... H01J 37/32183 |
| | | 315/111.21 |
| 2023/0352272 A1* | 11/2023 | Shoeb ............... H01J 37/32724 |
| 2024/0112886 A1* | 4/2024 | Shi ..................... H01J 37/3299 |
| 2024/0120185 A1* | 4/2024 | Tsuchiya ................. H05H 1/46 |

* cited by examiner

SYSTEMS AND METHODS FOR USE OF LOW FREQUENCY HARMONICS IN BIAS RADIOFREQUENCY SUPPLY TO CONTROL UNIFORMITY OF PLASMA PROCESS RESULTS ACROSS SUBSTRATE

This application is a national stage filing of and claims priority, under 35 U.S.C. § 371, to PCT/US2021/038647, filed on Jun. 23, 2021, which claims the benefit of U.S. Provisional Application No. 63/044,827, filed on Jun. 26, 2020. The entire disclosure of each application referenced above is incorporated herein by reference.

BACKGROUND

1. Field of the Disclosure

The present disclosure relates to semiconductor device fabrication.

2. Description of the Related Art

In the fabrication of semiconductor devices such as integrated circuits, memory cells, and the like, a series of manufacturing operations are performed to define features on a semiconductor wafer ("wafers" hereafter). The wafer includes integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

Many modern semiconductor chip fabrication processes include generation of a plasma from which ions and/or radical constituents are derived for use in either directly or indirectly affecting a change on a surface of a substrate exposed to the plasma. For example, various plasma-based processes can be used to etch material from a substrate surface, deposit material onto a substrate surface, or modify a material already present on a substrate surface. The plasma is often generated by applying radiofrequency (RF) power to a process gas in a controlled environment, such that the process gas becomes energized and transforms into the desired plasma. The characteristics of the plasma and corresponding process results on the substrate are affected by many process parameters including, but not limited to, material composition of the process gas, flow rate of the process gas, geometric features of the plasma generation region and surrounding structures, temperatures of the process gas and surrounding materials, frequency of the RF power applied, magnitude of the RF power applied, and temporal manner in which the RF power is applied, among others. Therefore, it is of interest to understand, monitor, and/or control some of the process parameters that may affect the characteristics of the generated plasma and corresponding process results on the substrate. It is within this context that the present disclosure arises.

SUMMARY

In an example embodiment, a radiofrequency (RF) signal supply system for a plasma processing system is disclosed. The RF signal supply system includes a first RF signal generator set to generate a first RF signal having a first frequency. The RF signal supply system also includes a second RF signal generator set to generate a second RF signal having a second frequency. The second frequency is a specified harmonic of the first frequency. The RF signal supply system also includes a third RF signal generator set to generate a third RF signal having a third frequency. The third frequency is a specified harmonic of the first frequency. The third frequency and the second frequency are different specified harmonics of the first frequency. The RF signal supply system also includes a fourth RF signal generator set to generate a fourth RF signal having a fourth frequency. The fourth frequency is at least two orders of magnitude larger than the first frequency.

In an example embodiment, a method is disclosed for operating an RF signal supply system for a plasma processing system. The method includes operating a first RF signal generator to generate a first RF signal having a first frequency at an output of the first RF signal generator. The method also includes operating a second RF signal generator to generate a second RF signal having a second frequency at an output of the second RF signal generator. The second frequency is a specified harmonic of the first frequency. The method also includes operating a third RF signal generator to generate a third RF signal having a third frequency at an output of the third RF signal generator. The third frequency is a specified harmonic of the first frequency. The third frequency and the second frequency are different specified harmonics of the first frequency. The method also includes operating a fourth RF signal generator to generate a fourth RF signal having a fourth frequency at an output of the fourth RF signal generator. The fourth frequency is at least two orders of magnitude larger than the first frequency. The method also includes operating an impedance matching system to control impedances at the output of the first RF signal generator, at the output of the second RF signal generator, at the output of the third RF signal generator, and at the output of the fourth RF signal generator. The first RF signal, the second RF signal, the third RF signal, and the fourth RF signal are transmitted through the impedance matching system to a radiofrequency supply input of the plasma processing system to cause generation of a plasma within the plasma processing system. The method also includes operating a control module to control a first phase difference between the second RF signal and the first RF signal. The method also includes operating the control module to control a second phase difference between the third RF signal and the first RF signal. The method also includes operating the control module to control a first voltage difference between the second RF signal and the first RF signal. The method also includes operating the control module to control a second voltage difference between the third RF signal and the first RF signal. The first phase difference, the second phase difference, the first voltage difference, and the second voltage difference collectively control a plasma sheath voltage as a function of time within the plasma processing system.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present disclosure. It will be apparent, however, to one skilled in the art that embodiments of the present disclosure may be practiced without some or all of these specific details. In other instances, well known process operations have not been described in detail in order not to unnecessarily obscure the present disclosure.

In the semiconductor industry, semiconductor substrates can undergo fabrication operations in various types of plasma chambers, such as capacitively coupled plasma (CCP) processing chambers and inductively coupled plasma (ICP) plasma processing chambers. In both CCP and ICP processing chambers, radiofrequency (RF) power is used to energize a process gas to transform the process gas into a plasma within a plasma processing region to which the substrate is exposed. Reactive species and/or charged species within the plasma interact with the substrate to modify a condition of the substrate, such as by modifying a material present on the substrate, or by depositing material on the substrate, or by removing/etching material from the substrate, by way of example. The CCP and ICP processing chambers are equipped with one or more electrodes and/or antenna that receive RF power for generating the plasma within the plasma processing region. Also, the CCP and ICP processing chambers are equipped with one or more electrodes that receive RF power and/or direct current (DC) power to generate a bias voltage at the substrate location for attracting charged species from the plasma toward the substrate.

Figure 1:
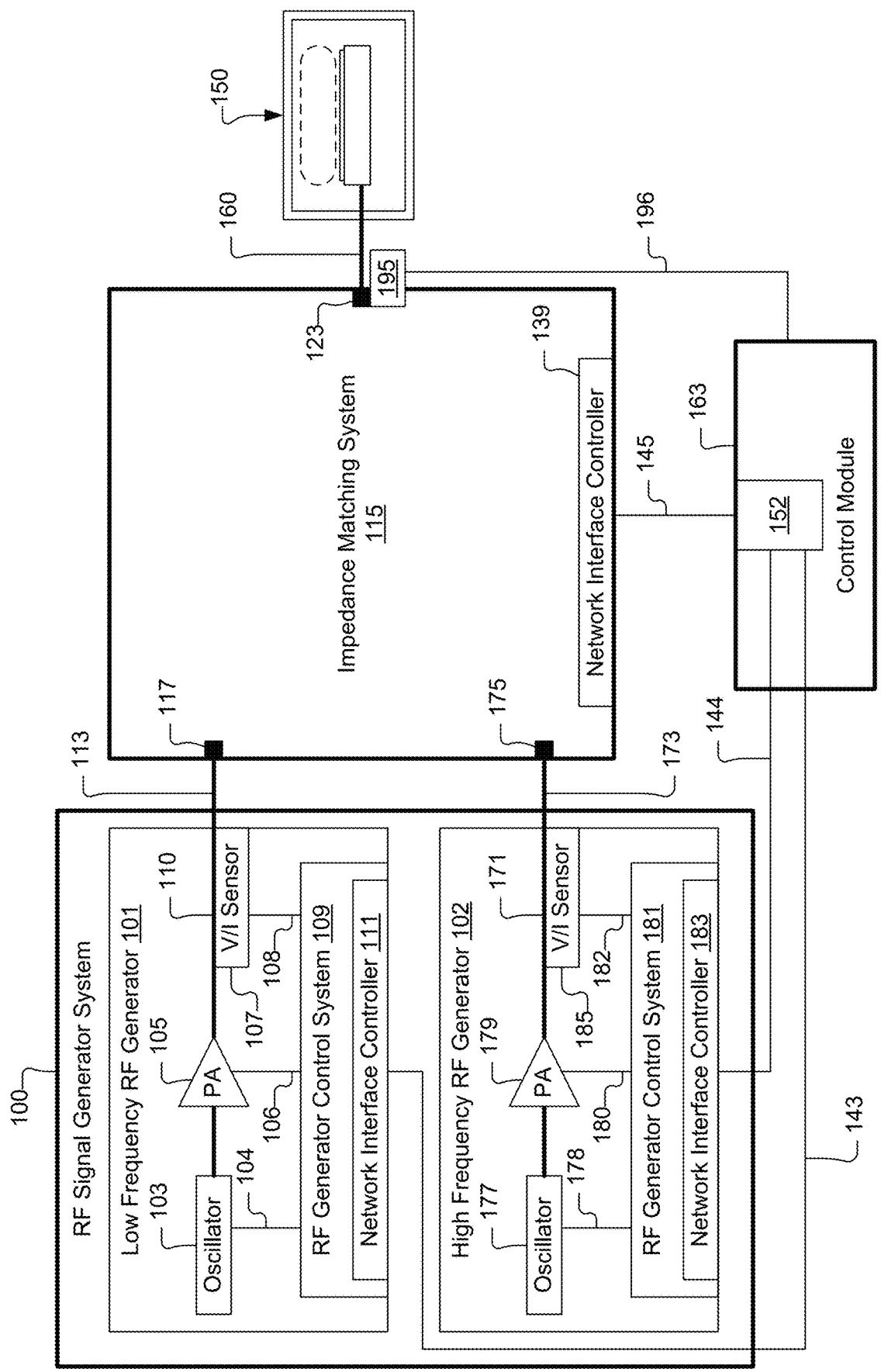
FIG. 1 shows an RF signal supply system that includes a low frequency RF signal generator and a high frequency RF signal generator, in accordance with some embodiments.

FIG. 1 shows an RF signal supply system 100 that includes a low frequency RF signal generator 101 and a high frequency RF signal generator 102, in accordance with some embodiments. Each of the low frequency RF signal generator 101 and the high frequency RF signal generator 102 is connected to supply RF signals through an impedance matching system 115 to plasma processing system 150. In various embodiments, the plasma processing system 150 is either a CCP processing system or an ICP processing system. In various embodiments, the RF signal supply system 100 is connected through the impedance matching system 115 to an electrode or antenna (coil) within the plasma processing system 150.

The low frequency RF signal generator 101 is configured to generate and transmit low frequency RF signals of controlled amplitude and frequency from an output 110 of the low frequency RF signal generator 101, through/along an electrical conductor 113, to an input 117 of the impedance matching system 115. The low frequency RF signals then travel from an output 123 of the impedance matching system 115, through/along the RF feed structure 160, to an electrode or antenna within the plasma processing system 150.

Similarly, the high frequency RF signal generator 102 is configured to generate and transmit high frequency RF signals of controlled amplitude and frequency from an output 171 of the high frequency RF signal generator 102, through/along an electrical conductor 173, to an input 175 of the impedance matching system 115. The high frequency RF signals then travel from the output 123 of the impedance matching system 115, through/along the RF feed structure 160, to an electrode or antenna within the plasma processing system 150.

The impedance matching system 115 includes a combination of capacitors and inductors configured and connected in an electrical circuit to match an impedance at the output 110 of the low frequency RF signal generator 101 to a design impedance (usually 50 Ohms). The impedance matching system 115 also includes a combination of capacitors and inductors configured and connected in an electrical circuit to match an impedance at the output 171 of the high frequency RF signal generator 102 to a design impedance (usually 50 Ohms). The impedance matching system 115 also includes a network interface controller (NIC) 139 that enables the impedance matching system 115 to send data to and receive data from systems outside of the impedance matching system 115. Examples of the NIC 139 include a network interface card, a network adapter, etc. In various embodiments, the NIC 139 is configured to operate in accordance with one or more network communication protocols and associate physical layers, such as Ethernet and/or EtherCAT, among others.

The low frequency RF signal generator 101 includes an oscillator 103 for generating RF signals. The oscillator 103 is an electronic circuit that produces a periodic oscillating electrical signal, such a sine wave electrical signal, having a specified frequency within the RF range. In some embodiments, the oscillator 103 is a low-frequency oscillator capable of oscillating within a frequency range extending from about 50 kiloHertz (kHz) to about 3 megaHertz (MHz). In some embodiments, the oscillator 103 is set to generate low frequency RF signals within a frequency range extending from about 330 kHz to about 440 kHz. In some embodiments, the oscillator 103 is set to generate low frequency RF signals of about 400 kHz. An output of the oscillator 103 is connected to an input of a power amplifier 105. The power amplifier 105 operates to amplify the low frequency RF signals generated by the oscillator 103, and transmit the amplified low frequency RF signals through an output of the power amplifier 105 to the output 110 of the low frequency RF signal generator 101.

The low frequency RF signal generator 101 also includes a control system 109 configured to provide for control of all operational aspects of the low frequency RF signal generator 101. In some embodiments, the control system 109 includes a processor, a data storage device, an input/output interface, and a data bus through which the processor, the data storage device, and the input/output interface communicate data to and from each other. The control system 109 is connected to provide for control of the oscillator 103, as indicated by connection 104. The control system 109 is also connected to provide for control of the power amplifier 105, as indicated by connection 106. The control system 109 also includes a NIC 111 that enables the control system 109 to send data to and receive data from systems outside of the low frequency RF signal generator 101. Examples of the NIC 111 include a network interface card, a network adapter, etc. In various embodiments, the NIC 111 is configured to operate in accordance with one or more network communication protocols and associate physical layers, such as Ethernet and/or EtherCAT, among others.

It should be understood that the control system 109 is connected and configured to control essentially any aspect of the low frequency RF signal generator 101. And, it should be understood that the control system 109 can be connected and configured to monitor essentially any physical and/or electrical state, condition, and/or parameter at essentially any location within the low frequency RF signal generator 101. The control system 109 is also configured to direct operation of the low frequency RF signal generator 101 in accordance with one or more prescribed algorithm(s). For example, the control system 109 is configured to operate the low frequency RF signal generator 101 by executing input and control instructions/programs. The input and control instructions/programs include a target RF power setpoint and a target frequency setpoint, among other parameters associated with operation and control of the low frequency RF signal generator 101.

The low frequency RF signal generator 101 also includes a voltage/current (V/I) sensor 107 connected to the output 110 of the low frequency RF signal generator 101. The V/I sensor 107 is connected to the control system 109, as shown by connection 108. In this configuration, the V/I sensor 107 provides a real-time measurement of voltage and current present on the output 110 of the low frequency RF signal generator 101 to the control system 109. In some embodiments, the V/I sensor 107 is disposed within the low frequency RF signal generator 101.

The high frequency RF signal generator 102 includes an oscillator 177 for generating RF signals. The oscillator 177 is an electronic circuit that produces a periodic oscillating electrical signal, such a sine wave electrical signal, having a specified frequency within the RF range. In some embodiments, the oscillator 177 is a high-frequency oscillator capable of oscillating within a frequency range extending from about 10 MHz to about 130 MHz. In some embodiments, the oscillator 177 is set to generate high frequency RF signals within a range extending from about 57 MHz to about 63 MHz. In some embodiments, the oscillator 177 is set to generate high frequency RF signals of about 60 MHz. An output of the oscillator 177 is connected to an input of a power amplifier 179. The power amplifier 179 operates to amplify the high frequency RF signals generated by the oscillator 177, and transmit the amplified high frequency RF signals through an output of the power amplifier 179 to the output 171 of the high frequency RF signal generator 102.

The high frequency RF signal generator 102 also includes a control system 181 configured to provide for control of all operational aspects of the high frequency RF signal generator 102. In some embodiments, the control system 181 includes a processor, a data storage device, an input/output interface, and a data bus through which the processor, the data storage device, and the input/output interface communicate data to and from each other. The control system 181 is connected to provide for control of the oscillator 177, as indicated by connection 178. The control system 181 is also connected to provide for control of the power amplifier 179, as indicated by connection 180. The control system 181 also includes a NIC 183 that enables the control system 181 to send data to and receive data from systems outside of the high frequency RF signal generator 102. Examples of the NIC 183 include a network interface card, a network adapter, etc. In various embodiments, the NIC 183 is configured to operate in accordance with one or more network communication protocols and associate physical layers, such as Ethernet and/or EtherCAT, among others.

It should be understood that the control system 181 is connected and configured to control essentially any aspect of the high frequency RF signal generator 102. And, it should be understood that the control system 181 can be connected and configured to monitor essentially any physical and/or electrical state, condition, and/or parameter at essentially any location within the high frequency RF signal generator 102. The control system 181 is also configured to direct operation of the high frequency RF signal generator 102 in accordance with a prescribed algorithm. For example, the control system 181 is configured to operate the high frequency RF signal generator 102 by executing input and control instructions/programs. The input and control instructions/programs include a target RF power setpoint and a target frequency setpoint, among other parameters associated with operation and control of the high frequency RF signal generator 102.

The high frequency RF signal generator 102 also includes a voltage/current (V/I) sensor 185 connected to the output 171 of the high frequency RF signal generator 102. The V/I sensor 185 is connected to the control system 181, as shown by connection 182. In this configuration, the V/I sensor 185 provides a real-time measurement of voltage and current present on the output 171 of the high frequency RF signal generator 102 to the control system 181. In some embodiments, the V/I sensor 185 is disposed within the high frequency RF signal generator 102.

In some embodiments, the control system 109 of the low frequency RF signal generator 101 is programmed to determine a real-time reflection coefficient (or Gamma (Γ)) at the output 110 of the low frequency RF signal generator 101, where $\Gamma = V_r/V_f$, with $V_r$ being the complex amplitude of the reflected RF signal, and with $V_f$ being the complex amplitude of the forward RF signal. Also, in some embodiments, the control system 109 of the low frequency RF signal generator 101 is also programmed to determine a voltage standing wave ratio (VSWR) at the output 110 of the low frequency RF signal generator 101, where $VSWR = |V_{max}|/|V_{min}| = (1+|\Gamma|)/(1-|\Gamma|)$, with $|V_{max}| = |V_f| + |V_r|$ and $|V_{min}| = |V_f| - |V_r|$. Minimization of the reflected RF power associated with the low frequency RF signal generated by the low frequency RF signal generator 101 occurs when the reflection coefficient at the output 110 of the low frequency RF signal generator 101 is as close to zero as possible. Also, minimization of the reflected RF power associated with the low frequency RF signal generated by the low frequency RF signal generator 101 occurs when the VSWR at the output 110 of the low frequency RF signal generator 101 is as close to one as possible, where one is the minimum possible value of VSWR. In some embodiments, the control system 109 is programmed to use the real-time measured voltage on the output 110 of the low frequency RF signal generator 101 to calculate the real-time reflection coefficient and/or VSWR at the output 110 of the low frequency RF signal generator 101. The real-time reflection coefficient and/or VSWR at the output 110 of the low frequency RF signal generator 101, as determined using voltage measurements taken within the low frequency RF signal generator 101, can be used as a feedback signal to minimize the reflection coefficient to as close to zero as possible and/or to minimize the VSWR to as close to one as possible.

Similarly, in some embodiments, the control system 181 of the high frequency RF signal generator 102 is programmed to determine the reflection coefficient (or Gamma (Γ)) and VSWR at the output 171 of the high frequency RF signal generator 102. Minimization of the reflected RF power associated with the high frequency RF signal generated by the high frequency RF signal generator 102 occurs when the reflection coefficient at the output 171 of the high frequency RF signal generator 102 is as close to zero as possible. Also, minimization of the reflected RF power associated with the high frequency RF signal generated by the high frequency RF signal generator 102 occurs when the VSWR at the output 171 of the high frequency RF signal generator 102 is as close to one as possible, where one is the minimum possible value of VSWR. In some embodiments, the control system 181 is programmed to use the real-time measured voltage on the output 171 of the high frequency RF signal generator 102 to calculate the real-time reflection coefficient and/or VSWR at the output 171 of the high frequency RF signal generator 102. The real-time reflection coefficient and/or VSWR at the output 171 of the high frequency RF signal generator 102, as determined using voltage measurements taken within the high frequency RF signal generator 102, can be used as a feedback signal to minimize the reflection coefficient to as close to zero as possible and/or to minimize the VSWR to as close to one as possible at the output 171 of the high frequency RF signal generator 102. Also, the real-time reflection coefficient and/or VSWR at the output 171 of the high frequency RF signal generator 102, as determined using voltage measurements taken within the high frequency RF signal generator 102, can be used to determine a reflected RF power at the output of the 171 of the high frequency RF signal generator 102.

A control module 163 of the plasma processing system 150 is connected to the control system 109 of the low frequency RF signal generator 101, by way of a NIC 152 and the NIC 111, as indicated by connection 143. The control module 163 is connected to the control system 181 of the high frequency RF signal generator 102, by way of the NIC 152 and the NIC 183, as indicated by connection 144. The control module 163 is connected to the impedance matching system 115, by way of the NIC 152 and the NIC 139, as indicated by connection 145. The NIC 152 enables the control module 163 to send data to and receive data from systems outside of the control module 163. Examples of the NIC 152 include a network interface card, a network adapter, etc. In various embodiments, the NIC 152 is configured to operate in accordance with one or more network communication protocols and associate physical layers, such as Ethernet and/or EtherCAT, among others.

In some embodiments, the control module 163 is programmed to direct operation of the low frequency RF signal generator 101 and the high frequency RF signal generator 102 in accordance with a frequency tuning process. The frequency tuning process automatically adjusts an operating frequency of the low frequency RF signal generator 101 about a target frequency of the low frequency signal to minimize reflected power at the output 110 of the low frequency RF signal generator 101. Also, in the frequency tuning process, an operating frequency of the high frequency RF signal generator 102 is automatically adjusted about a target frequency of the high frequency signal to minimize reflected power at the output 171 of the high frequency RF signal generator 102. In the frequency tuning process, the operating frequency of the high frequency RF signal generator 102 is separately adjusted about the target frequency of the high frequency signal in each of a plurality of temporal bins that collectively span a complete cycle of the low frequency signal generated by the low frequency RF signal generator 101, with the plurality of temporal bins and corresponding separate operating frequency adjustments (of the high frequency RF signal generator 102) repeating in sequence over each cycle of the low frequency signal generated by the low frequency RF signal generator 101.

Figure 2:
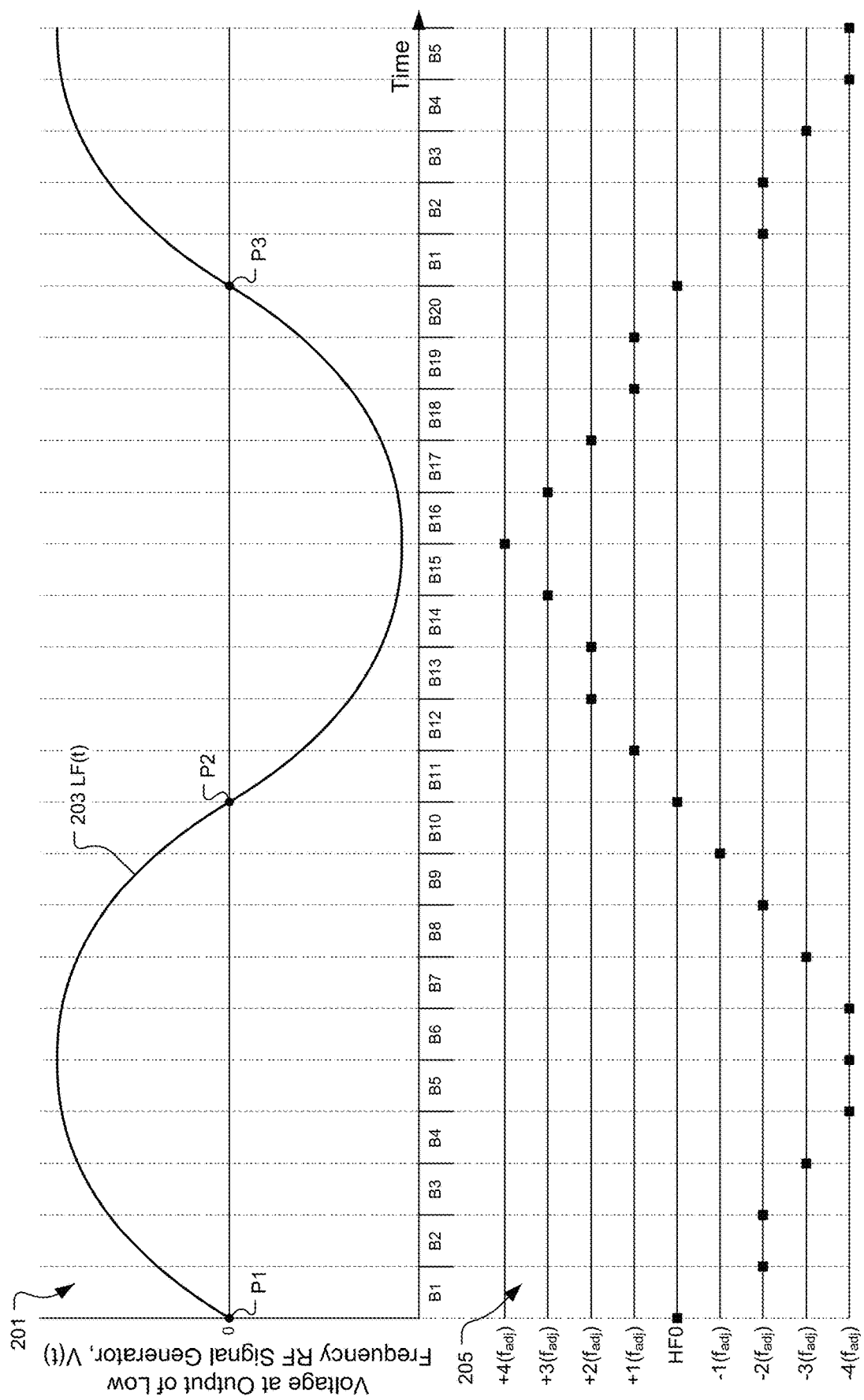
FIG. 2 shows a diagram of the frequency tuning process, in accordance with some embodiments.

FIG. 2 shows a diagram of the frequency tuning process, in accordance with some embodiments. An upper plot 201 shows a curve 203 of voltage measured as a function of time at the output 110 of the low frequency RF signal generator 101. The curve 203 represents the low frequency signal generated by the low frequency RF signal generator 101. The low frequency signal is a sinusoidal signal characterized by a repeating cycle. In the upper plot 201, a given cycle of the low frequency signal begins at a point P1 and ends at a point P3, with a point P2 marking the half-cycle location. In the example of FIG. 2, the cycle of the low frequency signal begins at the point P1 where the low frequency signal crosses the zero voltage level in the positive direction. This beginning location of the cycle of the low frequency signal is referred to herein as the positive direction zero voltage crossing of the low frequency signal. The half-cycle location occurs at the point P2 where the low frequency signal crosses the zero voltage level in the negative direction. And, the cycle of the low frequency signal ends at the point P3 where the low frequency signal again crosses the zero voltage level in the positive direction. The cycle of the low frequency signal is divided into a plurality of temporal bins B1 through B(N), where N is the total number of temporal bins. The example of FIG. 2 shows the cycle of the low frequency signal is divided into 20 (N=20) temporal bins B1 through B20. The first temporal bin B1 of the plurality of temporal bins B1 through B(N) begins at a positive direction zero voltage crossing of the complete cycle of the low frequency signal. The last temporal bin B(N) of the plurality of temporal bins B1 through B(N) ends at the next positive direction zero voltage crossing of the complete cycle of the low frequency signal.

It should be understood that the 20 temporal bins (N=20) of FIG. 2 is shown by way of example. In other embodiments, the plurality of temporal bins B1 through B(N) can have N set at either less than 20 or greater than 20. Also, the example of FIG. 2 shows that each of the plurality of temporal bins B1 through B(N) covers an equal amount of time. However, in other embodiments, different ones of the plurality of temporal bins B1 through B(N) can be defined to cover different amounts of time. For example, if a higher resolution of adjustment in the frequency of the high frequency signal, as generated by the high frequency RF signal generator 102, is required along a particular portion of the cycle of the low frequency signal, as generated by the low frequency RF signal generator 101, some of the plurality of temporal bins B1 through B(N) along the particular portion of the cycle of the low frequency signal are respectively defined to cover a smaller amount of time.

FIG. 2 also includes a lower plot 205 that shows adjustments of the operating frequency of the high frequency RF signal generator 102 at each of the plurality of temporal bins B1 through B20 that collectively span the complete cycle of the low frequency signal generated by the low frequency RF signal generator 101. The operating frequency of the high frequency RF signal generator 102 is set at an adjusted frequency during each of the plurality of temporal bins B1 through B20. The adjusted operating frequency of the high frequency RF signal generator 102 in any given one of the plurality of temporal bins B1 through B(N) is independently and separately set relative to others of the plurality of temporal bins B1 through B(N). In some embodiments, the adjusted frequency of a given one of the plurality of temporal bins B1 through B(N) is an integer multiple of a frequency adjustment amount ($f_{adj}$) about a target frequency (HF0) of the high frequency signal generated by the high frequency RF signal generator 102. For example, FIG. 2 shows a line corresponding to the target frequency (HF0) of the high frequency signal generated by the high frequency RF signal generator 102. FIG. 2 also shows lines for each of the integer multiples of the frequency adjustment amount ($f_{adj}$), respectively. As shown in FIG. 2, the adjusted frequency of a given one of the plurality of temporal bins B1 through B20 is an integer multiple of the frequency adjustment amount ($f_{adj}$) about the target frequency (HF0). In some embodiments, the integer multiple is either −4, −3, −2, −1, 0, +1, +2, +3, +4. However, in other embodiments, integer multiples less than −4 and/or greater than +4 can be used. Also, in some embodiments, the integer multiple is replaced by a fractional multiple. Also, in some embodiments, the frequency adjustment amount ($f_{adj}$) is set as the target frequency of the low frequency signal as generated by the low frequency RF signal generator 101. In the example of FIG. 2, if the target frequency of the low frequency signal as generated by the low frequency RF signal generator 101 is 400 kHz, then the bin-level operating frequency of the high frequency RF signal generator 102 at −4($f_{adj}$) is HF0−1600 kHz, and at −3($f_{adj}$) is HF0−1200 kHz, an at −2($f_{adj}$) is HF0−800 kHz, and at −1($f_{adj}$) is HF0−400 kHz, and at 0($f_{adj}$) is HF0, and at +1($f_{adj}$) is HF0+400 kHz, and at +2($f_{adj}$) is HF0+800 kHz, and at +3($f_{adj}$) is HF0+1200 kHz, and at +4($f_{adj}$) is HF0+1600 kHz. The operating frequency of the high frequency RF signal generator 102 for a given one the plurality of temporal bins B1 through B(N), e.g., the setting of integer multiple of the frequency adjustment amount ($f_{adj}$) for the given one of the plurality of temporal bins B1 through B(N), is determined empirically as the frequency adjustment that minimizes the reflected RF power at the output 171 of the high frequency RF signal generator 102 during the given one of the plurality of temporal bins B1 through B(N). Also, in some embodiments, the frequency adjustment amount ($f_{adj}$) is set at a determined amount of frequency that is different than the target frequency of the low frequency signal as generated by the low frequency RF signal generator 101.

The adjusted frequencies of the high frequency RF signal generator 102 across the plurality of temporal bins B1 through B(N) are repeated for each cycle of the low frequency signal generated by the low frequency RF signal generator 101. Periodically, the frequency tuning process will re-tune (re-determine) the adjusted frequencies of the high frequency RF signal generator 102 for the plurality of temporal bins B1 through B(N) to ensure that the reflected RF power at the output 171 of the high frequency RF signal generator 102 is minimized to the extent possible. In some embodiments, the frequency tuning process is implemented by programming the control module 163, which in turn directs operation of the control system 109 within the low frequency RF signal generator 101 and operation of the control system 181 within the high frequency RF signal generator 102.

Figure 3:
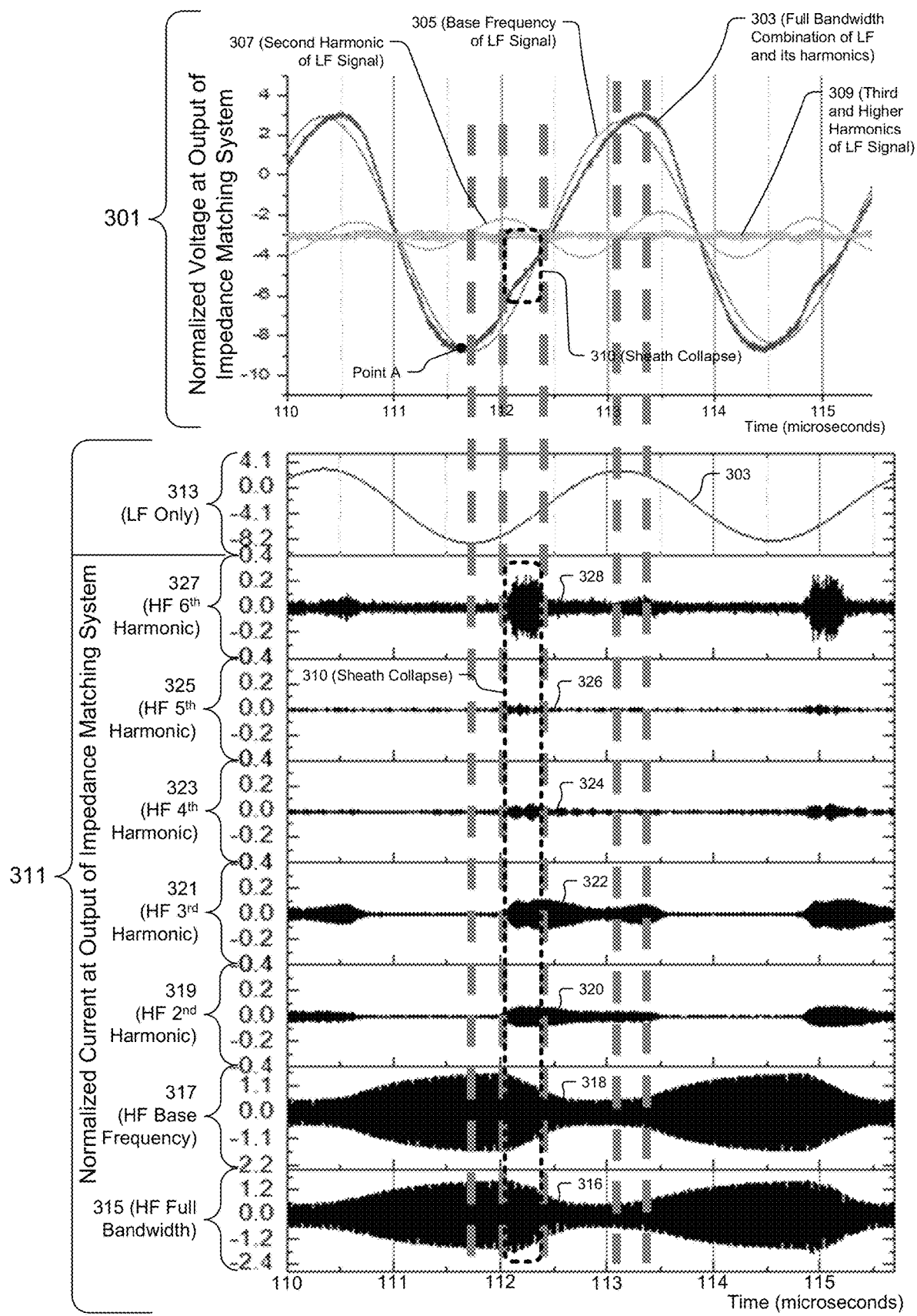
FIG. 3 shows various plots of normalized voltage and normalized current as a function of time as measured at the output of the impedance matching system, when the RF signal generation system is operating in accordance with the frequency tuning process of FIG. 2, in accordance with some embodiments.

FIG. 3 shows various plots of normalized voltage and normalized current as a function of time as measured at the output 123 of the impedance matching system 115, when the RF signal generation system 100 is operating in accordance with the frequency tuning process of FIG. 2, in accordance with some embodiments. With reference back to FIG. 1, a voltage/current (V/I) sensor 195 is connected to the output 123 of the impedance matching system 115. The V/I sensor 195 is connected to the control module 163, as shown by connection 196. In this configuration, the V/I sensor 195 provides a real-time measurement of voltage and current present at the output 123 of the impedance matching system 115 to the control module 163. The various plots shown in FIG. 3 correspond to voltage measurements or current measurements taken by the V/I sensor 195 at the output 123 of the impedance matching system 115.

FIG. 3 includes an upper plot 301 that shows normalized voltage as a function of time as measured at the output 123 of the impedance matching system 115, including normalized voltages associated with various harmonics of the low frequency RF signal generated by the low frequency RF signal generator 101, in accordance with some embodiments. The upper plot 301 shows a curve 303 representing normalized voltage as a function of time at the output 123 of the impedance matching system 115 corresponding to the full bandwidth combination of low frequency RF signals associated with the low frequency RF signal generated by the low frequency RF signal generator 101. The full bandwidth combination of low frequency RF signals includes the fundamental (base) low frequency RF signal generated by the low frequency RF signal generator 101 and all harmonic frequency signals associated with the fundamental (base) low frequency RF signal. The upper plot 301 also shows a curve 305 representing normalized voltage as a function of time at the output 123 of the impedance matching system 115 corresponding to just the fundamental (base) low frequency RF signal generated by the low frequency RF signal generator 101. The upper plot 301 also shows a curve 307 representing normalized voltage as a function of time at the output 123 of the impedance matching system 115 corresponding to a second harmonic frequency of the fundamental (base) low frequency RF signal generated by the low frequency RF signal generator 101. It should be understood that the second harmonic of the fundamental (base) low frequency RF signal corresponding to the curve 307 is sourced downstream of the output 123 of the impedance matching system 115 and is not generated by the low frequency RF signal generator 101. The upper plot 301 also shows a curve 309 representing normalized voltage as a function of time at the output 123 of the impedance matching system 115 corresponding to third and higher harmonic frequencies of the fundamental (base) low frequency RF signal generated by the low frequency RF signal generator 101. It should be understood that the third and higher harmonic frequencies of the fundamental (base) low frequency RF signal corresponding to the curve 309 are sourced downstream of the output 123 of the impedance matching system 115 and are not generated by the low frequency RF signal generator 101.

FIG. 3 also includes a lower plot 311 that shows normalized current as a function of time as measured at the output 123 of the impedance matching system 115 for the high frequency RF signal generated by the high frequency RF signal generator 102 and for various harmonic frequencies of the high frequency RF signal, in accordance with some embodiments. For reference, the lower plot 311 includes a subplot 313 that shows the curve 303 (as shown in the upper plot 301) corresponding to the full bandwidth combination of low frequency RF signals associated with the low frequency RF signal generated by the low frequency RF signal generator 101. The lower plot 311 includes a subplot 315 that shows a curve 316 representing normalized current as a function of time at the output 123 of the impedance matching system 115 corresponding to the full bandwidth combination of high frequency RF signals associated with the high frequency RF signal generated by the high frequency RF signal generator 102. The full bandwidth combination of high frequency RF signals includes the fundamental (base) high frequency RF signal generated by the high frequency RF signal generator 102 and all harmonic frequency signals associated with the fundamental (base) high frequency RF signal. In the example of FIG. 3, the high frequency RF signals have a fundamental (base) frequency of 60 MHz and the low frequency RF signals have a fundamental (base) frequency of 400 kHz. Therefore, the curve 316 of the normalized current corresponding to the high frequency RF signals cycles about 150 times faster that the curve 303 of the voltage corresponding to the low frequency RF signals. So, on a single-cycle scale of the low frequency RF signal curve 303, the high frequency RF signal curve 316 traces out a substantially solid region, as shown in FIG. 3.

The lower plot 311 also includes a subplot 317 that shows a curve 318 representing normalized current as a function of time at the output 123 of the impedance matching system 115 corresponding to just the fundamental (base) high frequency RF signal generated by the high frequency RF signal generator 102. The lower plot 311 also includes a subplot 319 that shows a curve 320 representing normalized current as a function of time at the output 123 of the impedance matching system 115 corresponding to a second harmonic frequency of the fundamental (base) high frequency RF signal generated by the high frequency RF signal generator 101. It should be understood that the second harmonic of the fundamental (base) high frequency RF signal corresponding to the curve 320 is sourced downstream of the output 123 of the impedance matching system 115 and is not generated by the high frequency RF signal generator 102. The lower plot 311 also includes a subplot 321 that shows a curve 322 representing normalized current as a function of time at the output 123 of the impedance matching system 115 corresponding to a third harmonic frequency of the fundamental (base) high frequency RF signal generated by the high frequency RF signal generator 101. It should be understood that the third harmonic of the fundamental (base) high frequency RF signal corresponding to the curve 322 is sourced downstream of the output 123 of the impedance matching system 115 and is not generated by the high frequency RF signal generator 102.

The lower plot 311 also includes a subplot 323 that shows a curve 324 representing normalized current as a function of time at the output 123 of the impedance matching system 115 corresponding to a fourth harmonic frequency of the fundamental (base) high frequency RF signal generated by the high frequency RF signal generator 101. It should be understood that the fourth harmonic of the fundamental (base) high frequency RF signal corresponding to the curve 324 is sourced downstream of the output 123 of the impedance matching system 115 and is not generated by the high frequency RF signal generator 102. The lower plot 311 also includes a subplot 325 that shows a curve 326 representing normalized current as a function of time at the output 123 of the impedance matching system 115 corresponding to a fifth harmonic frequency of the fundamental (base) high frequency RF signal generated by the high frequency RF signal generator 101. It should be understood that the fifth harmonic of the fundamental (base) high frequency RF signal corresponding to the curve 326 is sourced downstream of the output 123 of the impedance matching system 115 and is not generated by the high frequency RF signal generator 102. The lower plot 311 also includes a subplot 327 that shows a curve 328 representing normalized current as a function of time at the output 123 of the impedance matching system 115 corresponding to a sixth harmonic frequency of the fundamental (base) high frequency RF signal generated by the high frequency RF signal generator 101. It should be understood that the sixth harmonic of the fundamental (base) high frequency RF signal corresponding to the curve 328 is sourced downstream of the output 123 of the impedance matching system 115 and is not generated by the high frequency RF signal generator 102.

The curve 303 in the upper plot 301 (and in the subplot 313) shows that the normalized voltage as a function of time at the output 123 of the impedance matching system 115 corresponding to the full bandwidth combination of low frequency RF signals associated with the low frequency RF signal generated by the low frequency RF signal generator 101 exhibits a deviation in slope within a temporal region 310 as the voltage approaches the zero voltage level in the positive direction. The deviation in slope of the curve 303 within the temporal region 310 is caused by increase in plasma density caused by secondary electrons generated by ions at the substrate. The maximum flux of electrons and maximum of plasma density is delayed from maximum sheath voltage (Point A) due to ion inertia. Also, the deviation in slope of the curve 303 within the temporal region 310 occurs in conjunction with higher amplitudes of the higher order harmonic frequency signals associated with the fundamental (base) low frequency RF signal as generated by the low frequency RF signal generator 101.

Additionally, the higher order harmonic signals associated with the fundamental (base) high frequency RF signal generated by the high frequency RF signal generator 102, such as shown in subplots 319, 321, 323, 325, and 327, are not uniformly distributed throughout a given cycle of the low frequency RF signal generated by the low frequency RF signal generator 101. FIG. 3 shows that the deviation in slope of the voltage curve 303 within the temporal region 310 is correlated to higher amplitudes of higher order harmonic signals associated with the fundamental (base) high frequency RF signal generated by the high frequency RF signal generator 102. For example, the lower plot 311 shows an outline of the temporal region 310 across the subplots 315, 317, 319, 321, 323, 325, and 327. As shown within the temporal region 310 within subplots 319, 321, 323, 325, and 327, the normalized current associated with the higher order harmonics of the fundamental (base) high frequency RF signal is substantially increased at the onset of the plasma density increase due to the secondary electrons and is sustained through the duration of the plasma sheath collapse. Also, as shown within the temporal region 310 within the subplot 317, the normalized current corresponding to the fundamental (base) frequency of the high frequency RF signal drops significantly and rapidly at the onset of the plasma sheath collapse at the substrate level.

The plasma sheath potential is equal to a difference between the RF voltage applied to the plasma and a measured plasma potential. A standing wave in the plasma sheath potential occurs for a short period of time within the temporal window 310 at or near the onset of plasma sheath collapse. It is considered that the standing wave in the plasma sheath potential is attributed to occurrence of the higher order harmonics of the fundamental (base) high frequency RF signal. Also, the standing wave in the plasma sheath potential is considered to be responsible for non-uniformity in plasma process results across the substrate. For example, in plasma etching processes, the standing wave in plasma sheath potential is considered to be a contributing factor to center-to-middle (C/M) etch rate non-uniformity across the substrate, where center refers a center of a circular-shaped substrate and middle refers to a mid-radial location between the center and a peripheral edge of the circular-shaped substrate. In some high aspect ratio (HAR) etching applications, the C/M etch rate non-uniformity across the substrate is a global tilt problem related to offset in bottom critical dimension (BCD) of HAR features formed across the substrate. More specifically, ions that reach the bottom of the HAR structures are high energy ions. Therefore, to effectively etch HAR features, it is necessary to have high energy ions leave the plasma sheath and travel down to the etch front at the bottom of the HAR features. Because the high energy ions leave the plasma sheath at or near the maximum sheath potential, as driven by the low frequency RF signal generated by the low frequency RF signal generator 101, perturbations in the sheath potential (such as the aforementioned standing wave in the sheath potential) affect the production and distribution of high energy ions across the substrate and in turn manifest as C/M etch rate non-uniformity, and in particular as a form of C/M etch rate non-uniformity that adversely affects formation of HAR features within a central region of the substrate as compared to the mid-radial region of the substrate. When integrated over time, the standing wave in the sheath potential that occurs at or near the onset of the plasma sheath collapse during each cycle of the low frequency RF signal causes less overall etching to occur near the central region of the substrate as compared to near the mid-radial region of the substrate.

Also, the deviation in slope of the voltage curve 303 within the temporal region 310 is non-advantageous because the deviation in slope extends the duration over which the plasma sheath voltage is low enough to allow for collapse of the plasma sheath at the substrate level. In other words, it is more advantageous for the temporal region 310 to have a shorter duration in order to reduce the duration of plasma sheath collapse in a given cycle of the low frequency RF signal as generated by the low frequency RF signal generator 101.

Systems and methods are disclosed herein for mitigating the impact on C/M etch rate non-uniformity caused by plasma sheath collapse during each cycle of the low frequency RF signal as generated by the low frequency RF signal generator 101, when operating in accordance with the frequency tuning process of FIG. 2. The plasma sheath potential responds to the low frequency RF signal more than to the high frequency RF signal because the low frequency RF signal is much higher voltage that the high frequency RF signal. For example, in some implementations of the frequency tuning process of FIG. 2, the low frequency RF signal has a peak voltage of about 5 kiloVolts (kV), and the high frequency RF signal has a peak voltage of about 300 volts (V) to about 500 V. Therefore, the plasma sheath potential is driven by the low frequency RF signal, whereas the plasma density is driven by the high frequency RF signal. Therefore, the low frequency RF signal is more effective than the high frequency RF signal for tuning the plasma sheath impedance. Also, because of the significant difference in voltage between the low frequency RF signal and the high frequency RF signal, it is not practical to significantly change the plasma sheath voltage by changing the high frequency RF signal. When the plasma sheath potential collapses within a given cycle of the low frequency RF signal due to low voltage, it is possible to get different shapes for the plasma sheath voltage waveform as a function of time by changing the phase and/or voltage of higher order harmonic frequency signals associated with the fundamental (base) low frequency RF signal as generated by the low frequency RF signal generator 101. Because modification of the higher order harmonic frequency signals associated with the fundamental (base) low frequency RF signal causes modification of the plasma sheath potential, it is possible to use the higher order harmonic frequency signals associated with the fundamental (base) low frequency RF signal to control the plasma sheath potential and corresponding coupling of the high frequency RF signal to the plasma.

When operating in accordance with the frequency tuning process of FIG. 2, by manipulating the phase and/or voltage of higher order harmonic frequency signals associated with the fundamental (base) low frequency RF signal, it is possible to change the shape of the waveform of the full bandwidth low frequency RF signal voltage as a function of time, so as to cause an increase in integrated plasma sheath voltage over time, which will in turn provide for an improvement of plasma process result uniformity across the substrate, e.g., provide for a reduction in C/M etch rate non-uniformity. Also, by changing the shape of the waveform of the full bandwidth low frequency RF signal voltage as a function of time, it is possible to correspondingly change the coupling of the high frequency RF signal to the plasma as a function of time.

In some embodiments, when operating in accordance with the frequency tuning process of FIG. 2, one or more higher order harmonic frequency signals associated with the fundamental (base) low frequency RF signal are introduced (supplied to the plasma) with respective phase shifts and voltages set so as to interfere with signals generated within the plasma that have the same harmonic frequency. This interference caused by the introduced harmonic frequency signals serves to negate and/or reduce the impact that the plasma-generated signals of corresponding harmonic frequency have on the deviation in the slope of the full bandwidth low frequency RF signal curve 303 within the temporal region 310, as shown in FIG. 3, which in turn serves to reduce the non-uniformity in plasma process results across the substrate due to the integrated effect of the collapse of the plasma sheath potential in each cycle of the low frequency RF signal.

In some embodiments, when operating in accordance with the frequency tuning process of FIG. 2, the waveform of the full bandwidth low frequency RF signal is generated to have a non-sinusoidal shape so that plasma sheath collapse duration within each cycle of the low frequency RF signal is reduced. The reduction in plasma sheath collapse duration within each cycle of the low frequency RF signal serves to change the fraction of low frequency RF signal cycle time in which harmonic frequencies of the fundamental (base) low frequency signal are generated by the plasma, which in turn changes the amount of time in which standing waves are generated in the plasma sheath potential, which in turn changes the amount of time in which high energy ions are non-uniformly distributed across the substrate. The reduction in plasma sheath collapse duration within each cycle of the low frequency RF signal will have an even greater impact on reducing plasma process result non-uniformity across the substrate as the fundamental (base) frequency of the low frequency RF signal is reduced, such as reduced from about 400 kHz to about 50 kHz, with a corresponding increase in the overall duration of each cycle of the fundamental (base) low frequency RF signal.

Figure 4:
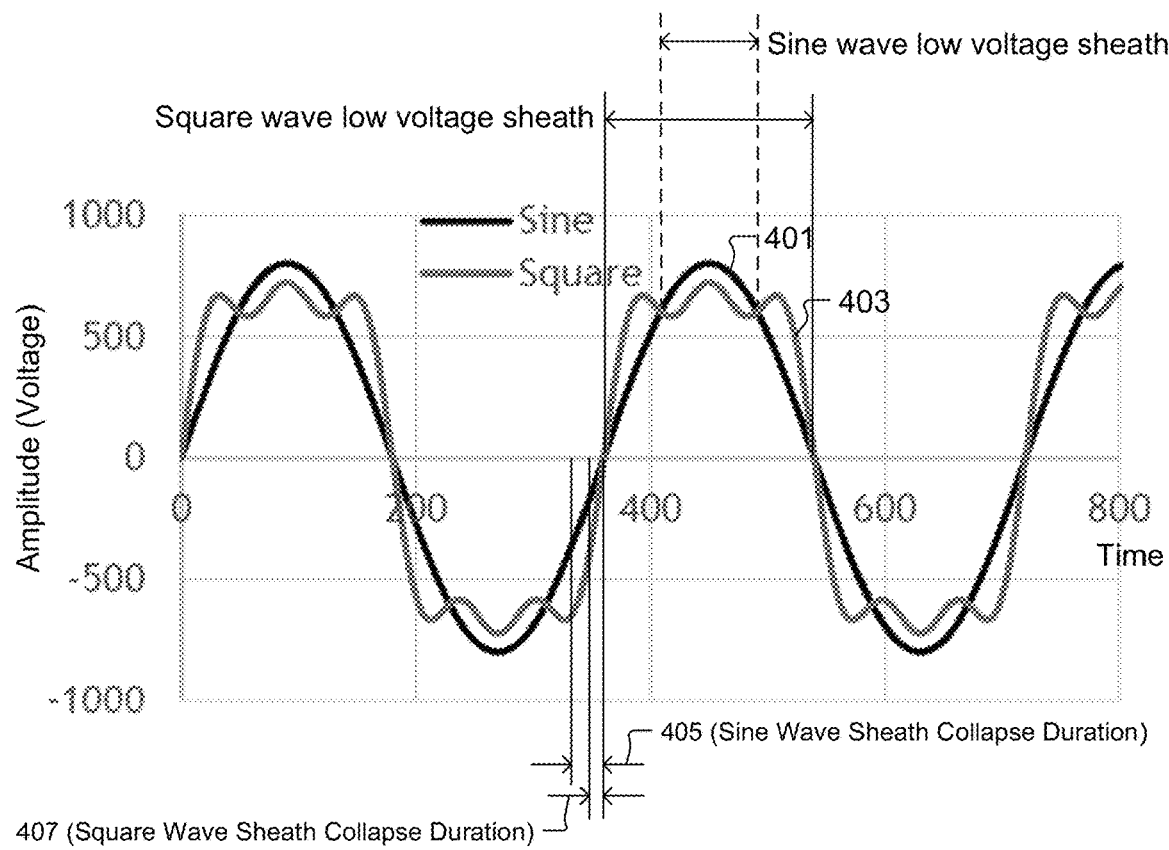
FIG. 4 shows an example of injecting higher order harmonic frequency signals in conjunction with the fundamental (base) frequency signal to generate a non-sinusoidal waveform shape, in accordance with some embodiments.

FIG. 4 shows an example of injecting higher order harmonic frequency signals in conjunction with the fundamental (base) frequency signal to generate a non-sinusoidal waveform shape, in accordance with some embodiments. In FIG. 4, the fundamental (base) frequency signal has a waveform that is represented by the curve 401, which has a sinusoidal shape. The third harmonic frequency signal and the fifth harmonic frequency signal of the fundamental (base) frequency are combined with the fundamental (base) frequency signal to generate a waveform represented by the curve 403, which has a square shape. If it is considered that the waveforms corresponding to the curve 401 and the curve 403 represent different waveforms of the full bandwidth low frequency RF signal generated in accordance with the frequency tuning process of FIG. 2, FIG. 4 demonstrates how use of the square-shaped waveform for the full bandwidth low frequency RF signal can serve to reduce the plasma sheath potential collapse time and increase the time of the low voltage plasma sheath per cycle as compared to use of the sinusoidal waveform for the full bandwidth low frequency RF signal. Specifically, based on the observed temporal region 310 in FIG. 3 in which the plasma sheath collapse occurs, the sinusoidal-shaped curve 401 is shown to have an estimated sheath collapse duration 405. And, the square-shaped curve 403 is shown to have an estimated sheath collapse duration 407. It is clearly evident that the estimated sheath collapse duration 407 of the square-shaped curve 403 is less than the estimated sheath collapse duration 405 of the sinusoidal curve 401. Therefore, waveform shaping of the full bandwidth low frequency RF signal can be achieved by combining higher order harmonic frequency signals of the fundamental (base) frequency signal with the fundamental (base) frequency signal in order to reduce the sheath collapse duration per cycle of the full bandwidth low frequency RF signal.

In some embodiments, when operating in accordance with the frequency tuning process of FIG. 2, the waveform of the full bandwidth low frequency RF signal is generated such that a negative half of each cycle of the full bandwidth low frequency RF signal has a longer duration than a positive half of each cycle of the full bandwidth low frequency RF signal. The plasma sheath potential is greatest during the negative half of each cycle of the full bandwidth low frequency RF signal. Therefore, if the waveform of the full bandwidth low frequency RF signal is configured to spend more time in the negative half of the cycle than in the positive half of the cycle, the plasma sheath potential will be greater over a larger amount of time. Also, with the plasma sheath potential being greater over a larger amount of time, the harmonic frequencies of the fundamental (base) high frequency RF signal will have less overall adverse effect on the plasma sheath potential and correspondingly less adverse effect on the plasma process result uniformity across the substrate.

Figure 5A:
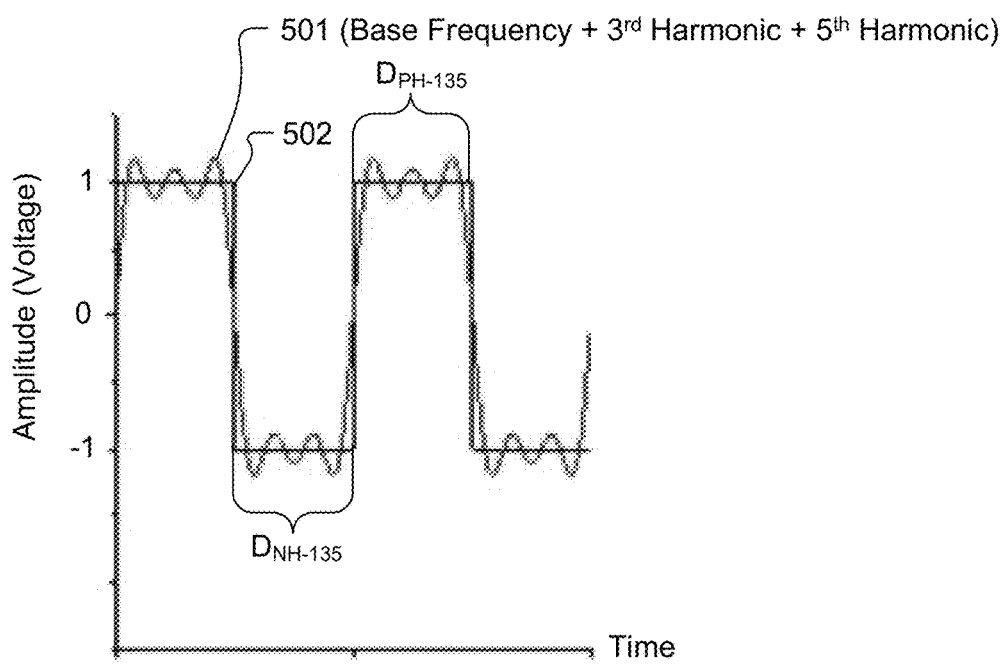
FIG. 5A shows a composite signal waveform that is a combination of a fundamental (base) frequency signal and a third harmonic frequency signal of the fundamental (base) frequency signal and a fifth harmonic frequency signal of the fundamental (base) frequency signal, in accordance with some embodiments.
Figure 5B:
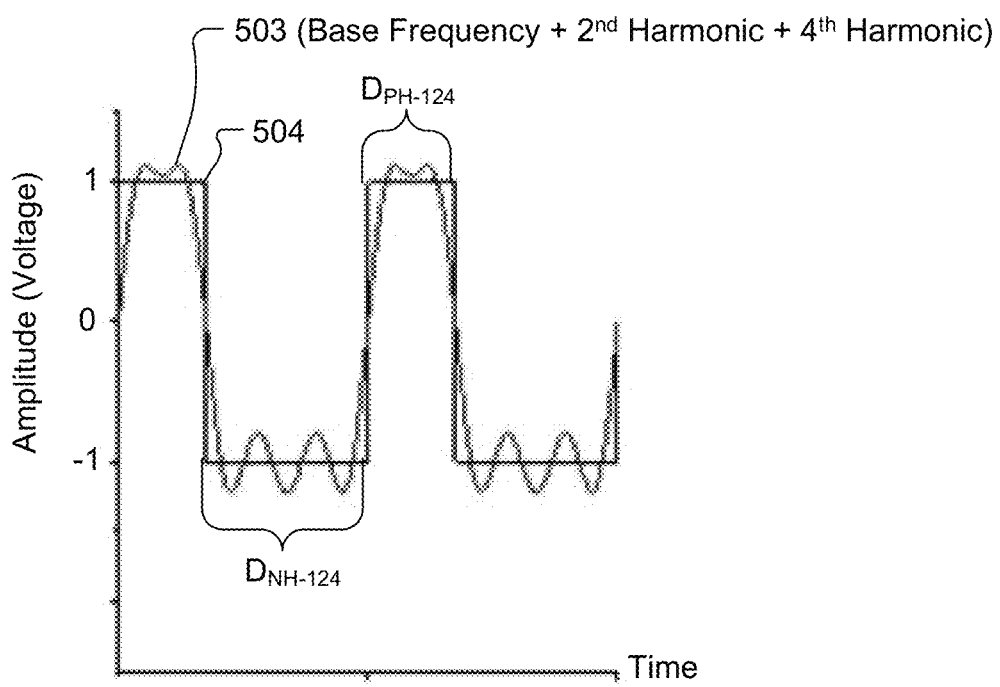
FIG. 5B shows a composite signal waveform that is a combination of a fundamental (base) frequency signal and a second harmonic frequency signal of the fundamental (base) frequency signal and a fourth harmonic frequency signal of the fundamental (base) frequency signal, in accordance with some embodiments.
Figure 5C:
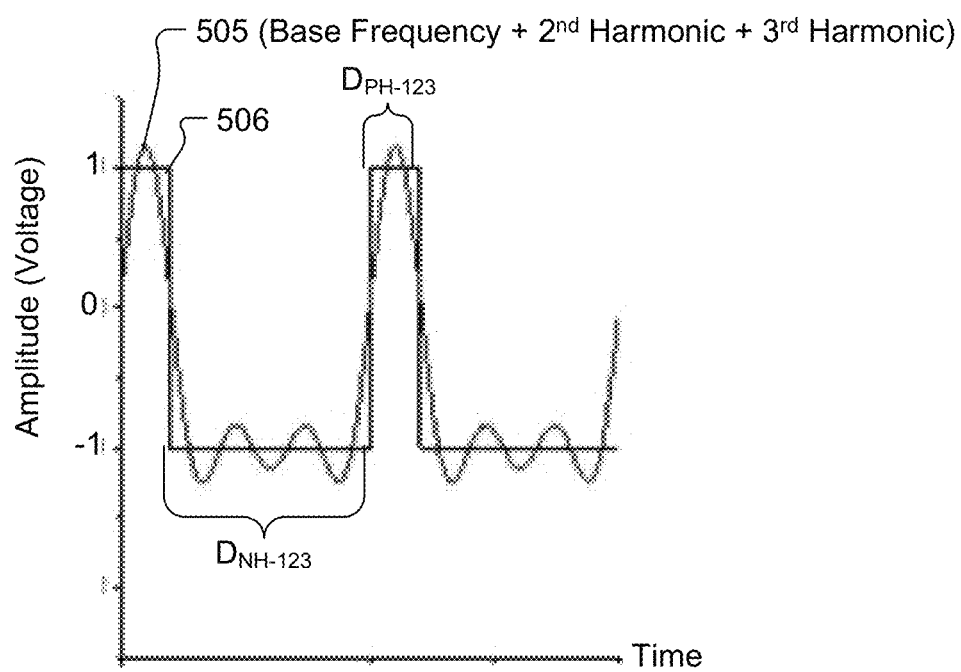
FIG. 5C shows a composite signal waveform that is a combination of a fundamental (base) frequency signal and a second harmonic frequency signal of the fundamental (base) frequency signal and a third harmonic frequency signal of the fundamental (base) frequency signal, in accordance with some embodiments.

FIGS. 5A, 5B, and 5C collectively show examples of how higher order harmonic frequency signals can be combined with the fundamental (base) frequency signal to generate a non-sinusoidal cyclical waveform shape in which a negative half of each cycle is longer that a positive half of each cycle, in accordance with some embodiments. FIG. 5A shows a composite signal waveform 501 that is a combination of a fundamental (base) frequency signal and a third harmonic frequency signal of the fundamental (base) frequency signal and a fifth harmonic frequency signal of the fundamental (base) frequency signal, in accordance with some embodiments. FIG. 5A also shows an ideal square wave signal waveform 502 for reference. Comparison of the composite signal waveform 501 with the ideal square wave signal waveform 502 shows that combination of the fundamental (base) frequency signal with the corresponding signals having the third and fifth harmonic frequencies of the fundamental (base) frequency results in the composite signal waveform 501 having an approximated square wave shape. In the example of FIG. 5A, each of the fundamental (base)

frequency signal, the third harmonic frequency signal of the fundamental (base) frequency signal, and the fifth harmonic frequency signal of the fundamental (base) frequency signal are aligned in phase with each other and have substantially equal amplitudes. The negative half of a given cycle of the composite signal waveform 501 has a duration $D_{NH-135}$. The positive half of the given cycle of the composite signal waveform 501 has a duration $D_{PH-135}$. In the composite signal waveform 501, the duration $D_{NH-135}$ of the negative half of the cycle is equal to the duration $D_{PH-135}$ of the positive half of the cycle. Therefore, a composite signal waveform, such as the waveform 501, formed by combining the fundamental (base) frequency signal with both a phase-aligned third harmonic frequency signal of the fundamental (base) frequency signal and a phase-aligned fifth harmonic frequency signal of the fundamental (base) frequency signal has a cycle defined by a negative half-cycle and a positive half-cycle of equal duration.

Particular harmonic frequency signals can be combined with the fundamental (base) frequency signal to generate a composite signal waveform that has a cycle defined by a negative half-cycle and a positive half-cycle of different duration. FIG. 5B shows a composite signal waveform 503 that is a combination of a fundamental (base) frequency signal and a second harmonic frequency signal of the fundamental (base) frequency signal and a fourth harmonic frequency signal of the fundamental (base) frequency signal, in accordance with some embodiments. FIG. 5B also shows an ideal square wave signal waveform 504 for reference. Comparison of the composite signal waveform 503 with the ideal square wave signal waveform 504 shows that combination of the fundamental (base) frequency signal with the corresponding signals having the second and fourth harmonic frequencies of the fundamental (base) frequency results in the composite signal waveform 503 having an approximated square wave shape. In the example of FIG. 5B, each of the fundamental (base) frequency signal, the second harmonic frequency signal of the fundamental (base) frequency signal, and the fourth harmonic frequency signal of the fundamental (base) frequency signal are aligned in phase with each other and have substantially equal amplitudes. The negative half of a given cycle of the composite signal waveform 503 has a duration $D_{NH-124}$. The positive half of the given cycle of the composite signal waveform 503 has a duration $D_{PH-124}$. In the composite signal waveform 503, the duration $D_{NH-124}$ of the negative half of the cycle is greater than the duration $D_{PH-124}$ of the positive half of the cycle. Therefore, a composite signal waveform, such as the waveform 503, formed by combining the fundamental (base) frequency signal with both a phase-aligned second harmonic frequency signal of the fundamental (base) frequency signal and a phase-aligned fourth harmonic frequency signal of the fundamental (base) frequency signal has a cycle in which the negative half-cycle has greater duration than the positive half-cycle.

FIG. 5C shows a composite signal waveform 505 that is a combination of a fundamental (base) frequency signal and a second harmonic frequency signal of the fundamental (base) frequency signal and a third harmonic frequency signal of the fundamental (base) frequency signal, in accordance with some embodiments. FIG. 5C also shows an ideal square wave signal waveform 506 for reference. Comparison of the composite signal waveform 505 with the ideal square wave signal waveform 506 shows that combination of the fundamental (base) frequency signal with the corresponding signals having the second and third harmonic frequencies of the fundamental (base) frequency results in the composite signal waveform 505 having an approximated square wave shape. In the example of FIG. 5C, each of the fundamental (base) frequency signal, the second harmonic frequency signal of the fundamental (base) frequency signal, and the third harmonic frequency signal of the fundamental (base) frequency signal are aligned in phase with each other and have substantially equal amplitudes. The negative half of a given cycle of the composite signal waveform 505 has a duration $D_{NH-123}$. The positive half of the given cycle of the composite signal waveform 505 has a duration $D_{PH-123}$. In the composite signal waveform 505, the duration $D_{NH-123}$ of the negative half of the cycle is greater than the duration $D_{PH-123}$ of the positive half of the cycle. Therefore, a composite signal waveform, such as the waveform 505, formed by combining the fundamental (base) frequency signal with both a phase-aligned second harmonic frequency signal of the fundamental (base) frequency signal and a phase-aligned third harmonic frequency signal of the fundamental (base) frequency signal has a cycle in which the negative half-cycle has greater duration than the positive half-cycle. Also, the duration $D_{NH-123}$ of the negative half of the cycle of the composite signal waveform 505 is greater than the duration $D_{NH-124}$ of the negative half of the cycle of the composite signal waveform 503 of FIG. 5B. As shown in FIGS. 5A, 5B, and 5C, different harmonic frequency signals can be combined with a fundament (base) frequency signal to generate composite waveforms of different shape, particular with regard to the duration of the negative half-cycle relative to the duration of the positive half-cycle within the composite waveforms.

Figure 6:
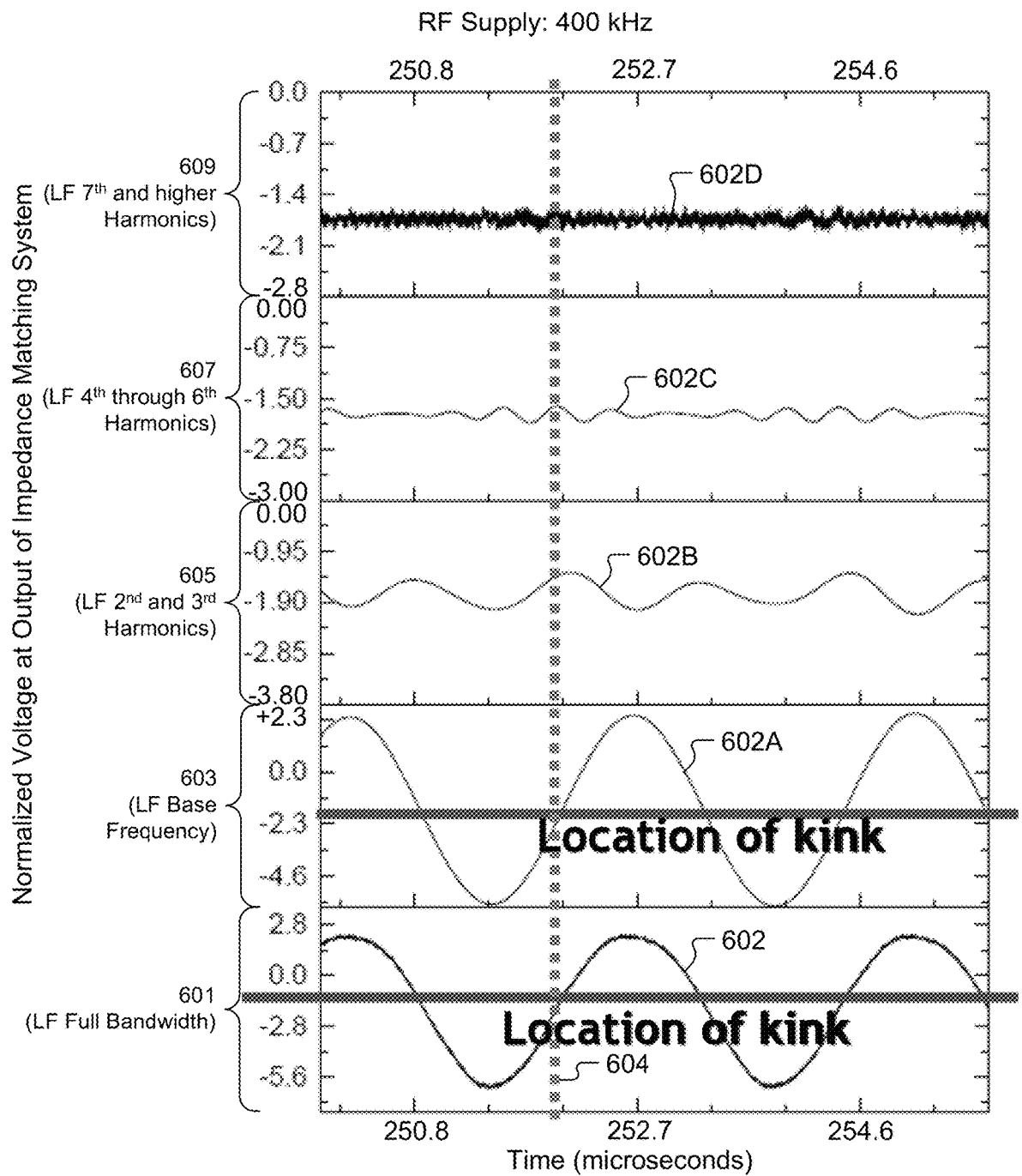
FIG. 6 shows a reference low frequency RF signal of sinusoidal shape, along with its harmonic frequency signal components, in accordance with some embodiments.
Figure 7:
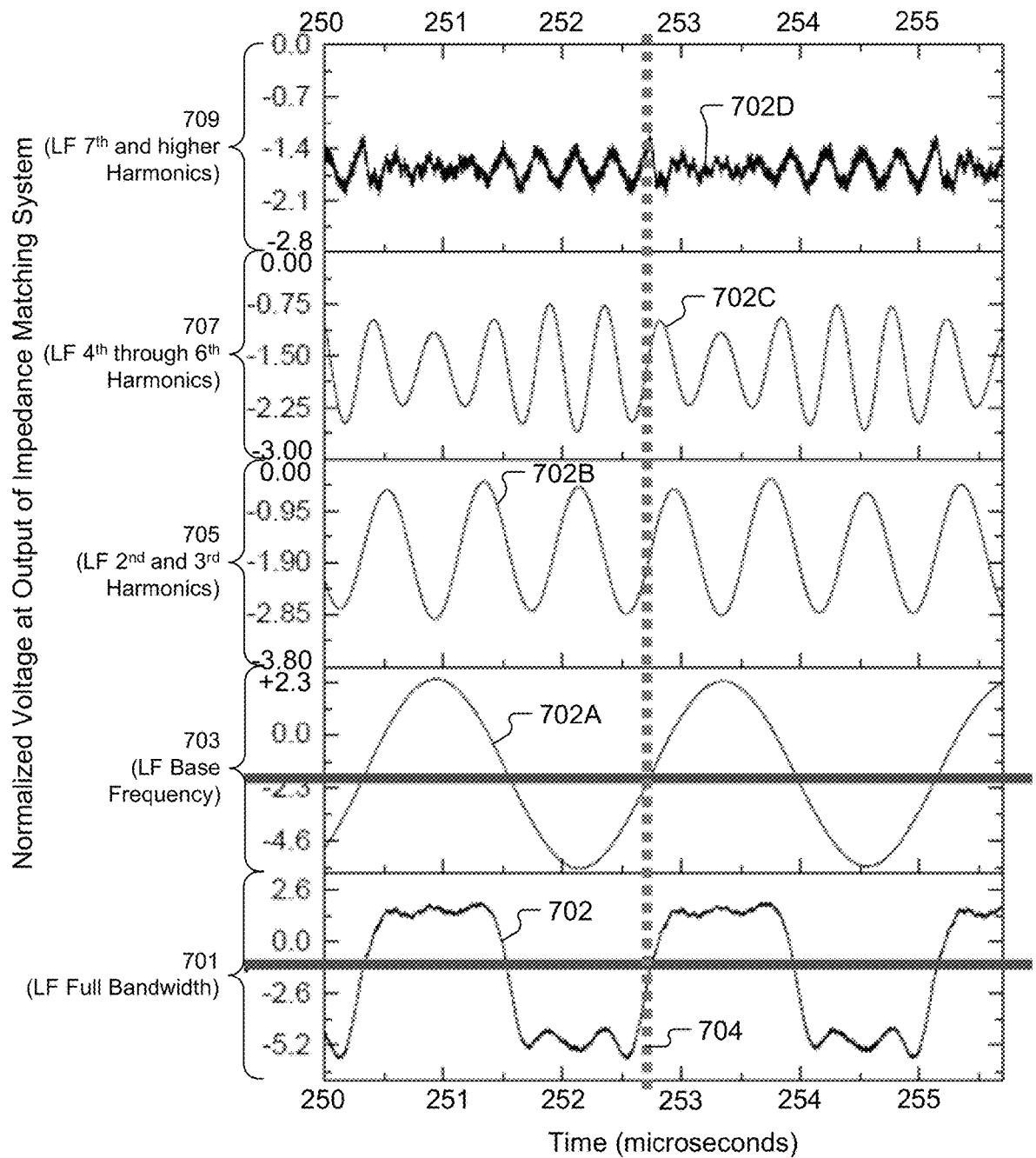
FIG. 7 shows a composite low frequency RF signal of substantially square shape formed by combining phase-aligned third and fifth harmonic frequency signals with a fundamental (base) frequency signal, in accordance with some embodiments.
Figure 8:
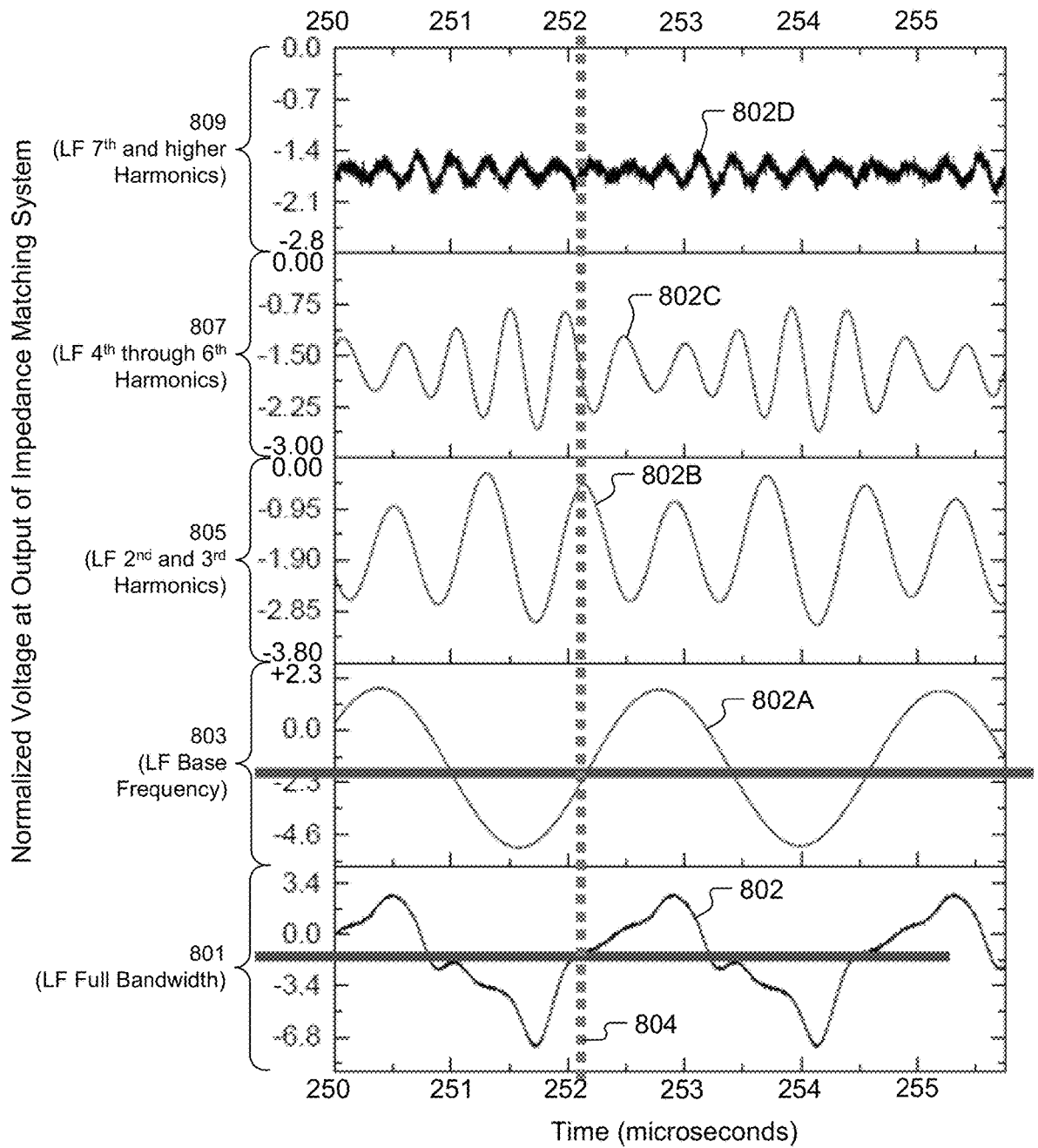
FIG. 8 shows a composite low frequency RF signal of sloped square shape formed by combining phase-shifted third and fifth harmonic frequency signals with a fundamental (base) frequency signal, in accordance with some embodiments.

FIGS. 6, 7, and 8 collectively show examples of how higher order harmonic frequency signals of the fundamental (base) low frequency RF signal can be generated and combined with the fundamental (base) low frequency RF signal to generate a non-sinusoidal cyclical waveforms for the full bandwidth low frequency RF signal, when operating in accordance with the frequency tuning process of FIG. 2, in accordance with some embodiments. FIG. 6 shows a reference low frequency RF signal 602 of sinusoidal shape, along with its harmonic frequency signal components, in accordance with some embodiments. FIG. 6 includes a subplot 601 that shows a full bandwidth version of the reference low frequency RF signal 602 used in the frequency tuning process of FIG. 2, in accordance with some embodiments. A subplot 603 shows a fundamental (base) frequency component signal 602A of the full bandwidth version of the reference low frequency RF signal 602. A subplot 605 shows a component signal 602B that includes second and third harmonic frequencies of the full bandwidth version of the reference low frequency RF signal 602. A subplot 607 shows a component signal 602C that includes fourth, fifth, and sixth harmonic frequencies of the full bandwidth version of the reference low frequency RF signal 602. A subplot 609 shows a component signal 602D that includes seventh and higher harmonic frequencies of the full bandwidth version of the reference low frequency RF signal 602. Also, for reference, FIG. 6 shows a line 604 corresponding to the time at which the collapse of the sheath potential occurs, which corresponds to the temporal region 310 in which the deviation in slope of the curve 303 occurs in FIG. 3.

FIG. 7 shows a composite low frequency RF signal 702 of substantially square shape formed by combining phase-aligned third and fifth harmonic frequency signals with a fundamental (base) frequency signal, in accordance with some embodiments. FIG. 7 includes a subplot 701 that shows a full bandwidth version of the composite low frequency RF signal 702 used in the frequency tuning process of FIG. 2, in accordance with some embodiments. The composite low frequency RF signal 702 is formed by combining a fundamental (base) frequency signal of 400 kHz with both the third harmonic frequency signal of 1.2 MHz and the fifth harmonic frequency signal of 2 MHz. The total power of the composite low frequency RF signal 702 is distributed as 80% coming from the fundamental (base) frequency signal of 400 kHz, 15% coming from the third harmonic frequency signal of 1.2 MHz, and 5% coming from the fifth harmonic frequency signal of 2 MHz. A subplot 703 shows a fundamental (base) frequency component signal 702A of the full bandwidth version of the composite low frequency RF signal 702. A subplot 705 shows a component signal 702B that includes second and third harmonic frequencies of the full bandwidth version of the composite low frequency RF signal 702. A subplot 707 shows a component signal 702C that includes fourth, fifth, and sixth harmonic frequencies of the full bandwidth version of the composite low frequency RF signal 702. A subplot 709 shows a component signal 702D that includes seventh and higher harmonic frequencies of the full bandwidth version of the composite low frequency RF signal 702. Also, for reference, FIG. 7 shows a line 704 corresponding to the time at which the collapse of the sheath potential occurs, which corresponds to the temporal region 310 in which the deviation in slope of the curve 303 occurs in FIG. 3.

FIG. 8 shows a composite low frequency RF signal 802 of sloped-square shape formed by combining phase-shifted third and fifth harmonic frequency signals with a fundamental (base) frequency signal, in accordance with some embodiments. FIG. 8 includes a subplot 801 that shows a full bandwidth version of the composite low frequency RF signal 802 used in the frequency tuning process of FIG. 2, in accordance with some embodiments. The composite low frequency RF signal 802 is formed by combining a fundamental (base) frequency signal of 400 kHz with both the third harmonic frequency signal of 1.2 MHz and the fifth harmonic frequency signal of 2 MHz, with each of the third harmonic frequency signal and the fifth harmonic frequency signal shifted in phase by 30 degrees relative to the fundamental (base) frequency signal. The total power of the composite low frequency RF signal 802 is distributed as 80% coming from the fundamental (base) frequency signal of 400 kHz, 15% coming from the third harmonic frequency signal of 1.2 MHz, and 5% coming from the fifth harmonic frequency signal of 2 MHz. A subplot 803 shows a fundamental (base) frequency component signal 802A of the full bandwidth version of the composite low frequency RF signal 802. A subplot 805 shows a component signal 802B that includes second and third harmonic frequencies of the full bandwidth version of the composite low frequency RF signal 802. A subplot 807 shows a component signal 802C that includes fourth, fifth, and sixth harmonic frequencies of the full bandwidth version of the composite low frequency RF signal 802. A subplot 809 shows a component signal 802D that includes seventh and higher harmonic frequencies of the full bandwidth version of the composite low frequency RF signal 802. Also, for reference, FIG. 8 shows a line 804 corresponding to the time at which the collapse of the sheath potential occurs, which corresponds to the temporal region 310 in which the deviation in slope of the curve 303 occurs in FIG. 3.

Figure 9:
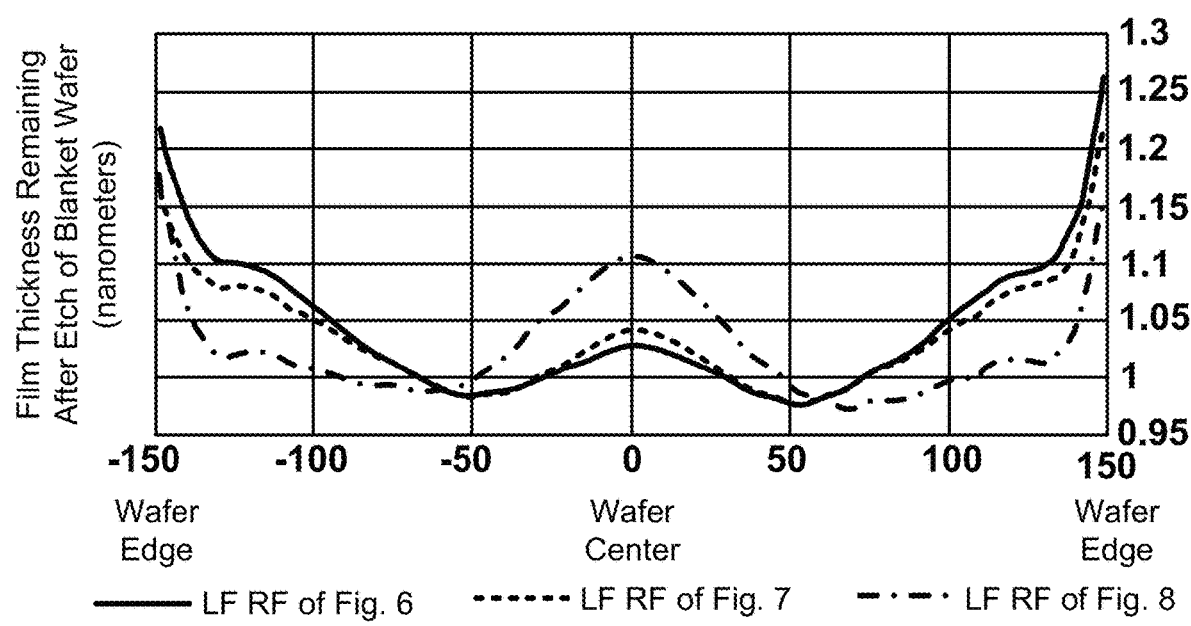
FIG. 9 shows a plot of average film thickness versus radial position across the substrate obtained by performing etching processes in accordance with the frequency tuning process of FIG. 2, with each etching process using a different one of the reference sinusoidal low frequency RF signal of FIG. 6, the composite square-shaped low frequency RF signal of FIG. 7, and the composite sloped-square-shaped low frequency RF signal of FIG. 8, in accordance with some embodiments.

Each of the reference sinusoidal low frequency RF signal 602 of FIG. 6, the composite square-shaped low frequency RF signal 702 of FIG. 7, and the composite sloped-square-shaped low frequency RF signal 802 of FIG. 8 has a corresponding effect on the plasma sheath potential within the temporal region of the low frequency RF signal cycle, e.g., the temporal region 310, in which plasma sheath potential collapses. Therefore, each of the reference sinusoidal low frequency RF signal 602 of FIG. 6, the composite square-shaped low frequency RF signal 702 of FIG. 7, and the composite sloped-square-shaped low frequency RF signal 802 of FIG. 8 has a corresponding effect on the uniformity of plasma process results across the substrate. FIG. 9 shows a plot of average film thickness versus radial position across the substrate obtained by performing etching processes in accordance with the frequency tuning process of FIG. 2, with each etching process using a different one of the reference sinusoidal low frequency RF signal 602 of FIG. 6, the composite square-shaped low frequency RF signal 702 of FIG. 7, and the composite sloped-square-shaped low frequency RF signal 802 of FIG. 8, in accordance with some embodiments. The data shown in FIG. 9 was obtained by subjecting a silicon substrate having a blanket silicon oxide film deposited thereon to a 60 second etching process in accordance with the frequency tuning process of FIG. 2, in which the high frequency RF signal was applied at 60 MHz and 3.5 kW, and in which the low frequency RF signal was applied at 12.5 kW as either the reference sinusoidal low frequency RF signal 602 of FIG. 6, the composite square-shaped low frequency RF signal 702 of FIG. 7, or the composite sloped-square-shaped low frequency RF signal 802 of FIG. 8. FIG. 9 demonstrates that the waveform shape of the low frequency RF signal used in the frequency tuning process of FIG. 2 has an effect on the uniformity of plasma process results across the substrate, such as on the center-to-middle etch rate uniformity.

Figure 10:
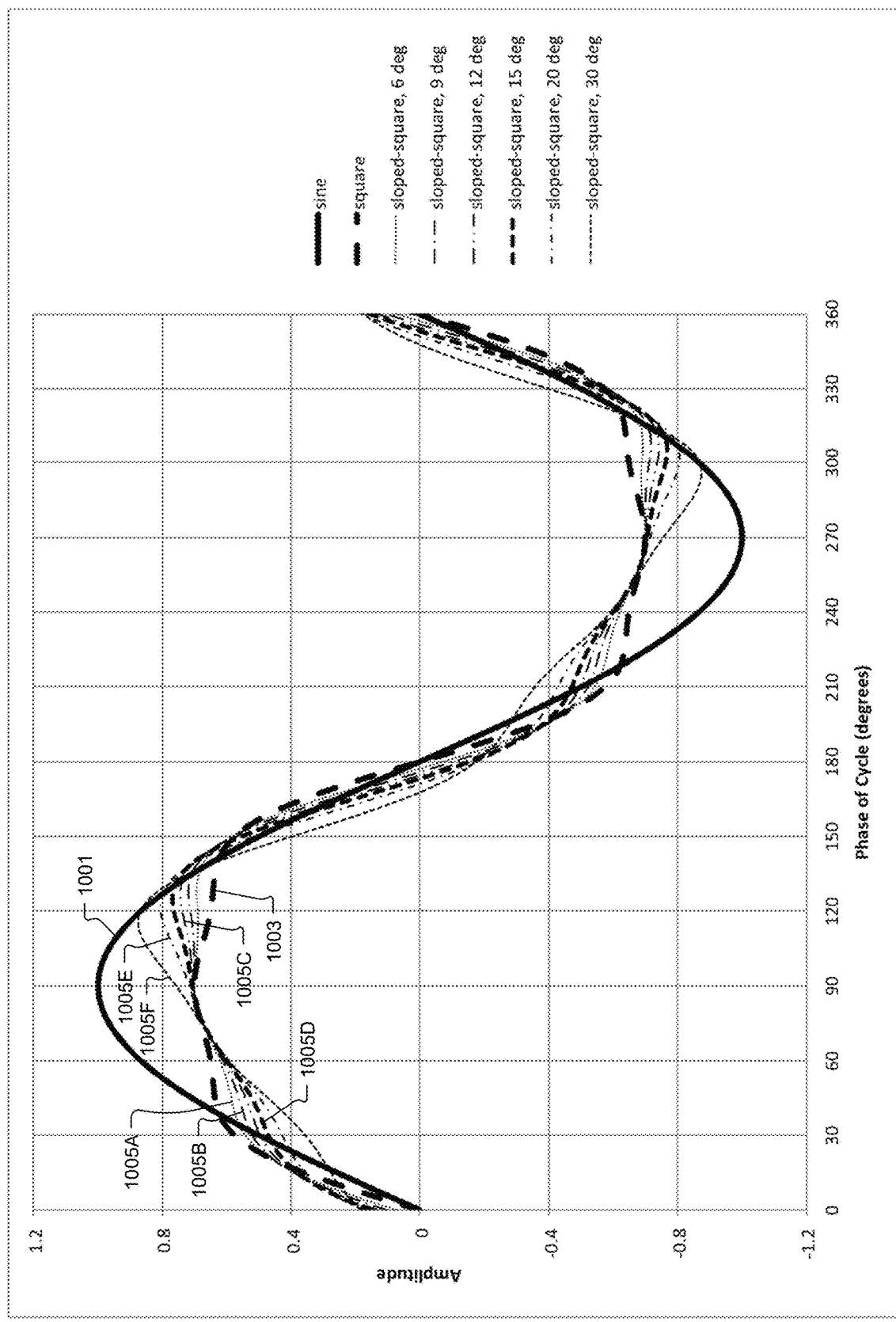
FIG. 10 shows various waveform shapes that are obtained by combining the third harmonic frequency signal and the fifth harmonic frequency signal with the fundamental (base) frequency signal, and by shifting the phase of the third and fifth harmonic frequency signals relative to the phase of the fundamental (base) frequency signal by various amounts, in accordance with some embodiments.

As shown in the example of FIG. 8, when higher order harmonic frequency signals of the fundamental (base) low frequency RF signal are generated and combined with the fundamental (base) low frequency RF signal to generate a composite cyclical waveform for the full bandwidth low frequency RF signal, the phase of the high order harmonic signals can be adjusted to obtain different waveform shapes. FIG. 10 shows various waveform shapes that are obtained by combining the third harmonic frequency signal and the fifth harmonic frequency signal with the fundamental (base) frequency signal, and by shifting the phase of the third and fifth harmonic frequency signals relative to the phase of the fundamental (base) frequency signal by various amounts, in accordance with some embodiments. FIG. 10 shows a sinusoidal reference signal 1001 corresponding to Equation 1. FIG. 10 also shows a square-shaped waveform signal 1003 corresponding to Equation 2, where $A_{400kHz}$ is the relative power of the fundamental (base) frequency component, $B_{1.2MHz}$ is the relative power of the third harmonic frequency component, and $C_{2MHz}$ is the relative power of the fifth harmonic frequency component. FIG. 10 also shows sloped-square-shaped waveform signal 1005A through 1005F corresponding to Equation 3, where $A_{400kHz}$ is the relative power of the fundamental (base) frequency component, $B_{1.2MHz}$ is the relative power of the third harmonic frequency component, $C_{2MHZ}$ is the relative power of the fifth harmonic frequency component, and $(\Delta\phi)$ is the shift in phase between the fundamental (base) frequency component and each of the third and fifth harmonic frequency components. Specifically, waveform signal 1005A corresponds to a shift in phase $(\Delta\phi)$ of 6 degrees. Waveform signal 1005B corresponds to a shift in phase $(\Delta\phi)$ of 9 degrees. Waveform signal 1005C corresponds to a shift in phase $(\Delta\phi)$ of 12 degrees. Waveform signal 1005D corresponds to a shift in phase $(\Delta\phi)$ of 15 degrees. Waveform signal 1005E corresponds to a shift in phase $(\Delta\phi)$ of 20 degrees. Waveform signal 1005F corresponds to a shift in phase (Δφ) of 30 degrees. In some embodiments, the sloped-square-shaped waveforms, such as 1005A through 1005F by way of example, can be utilized to compensate for charging during the low frequency RF signal cycle.

$$Y = A_{400kHz} \sin\varphi \qquad \text{Equation 1:}$$

$$Y = A_{400kHz} \sin(\varphi) + B_{1.2MHz} \sin(3\varphi) + C_{2MHz} \sin(5\varphi) \qquad \text{Equation 2:}$$

$$Y = A_{400kHZ} \sin(\varphi) + B_{1.2MHz} \sin(3\varphi - (360 - (3\Delta\varphi))) + C_{2MHz} \sin(5\ -(360-(5\Delta\varphi))) \qquad \text{Equation 3:}$$

Figure 11:
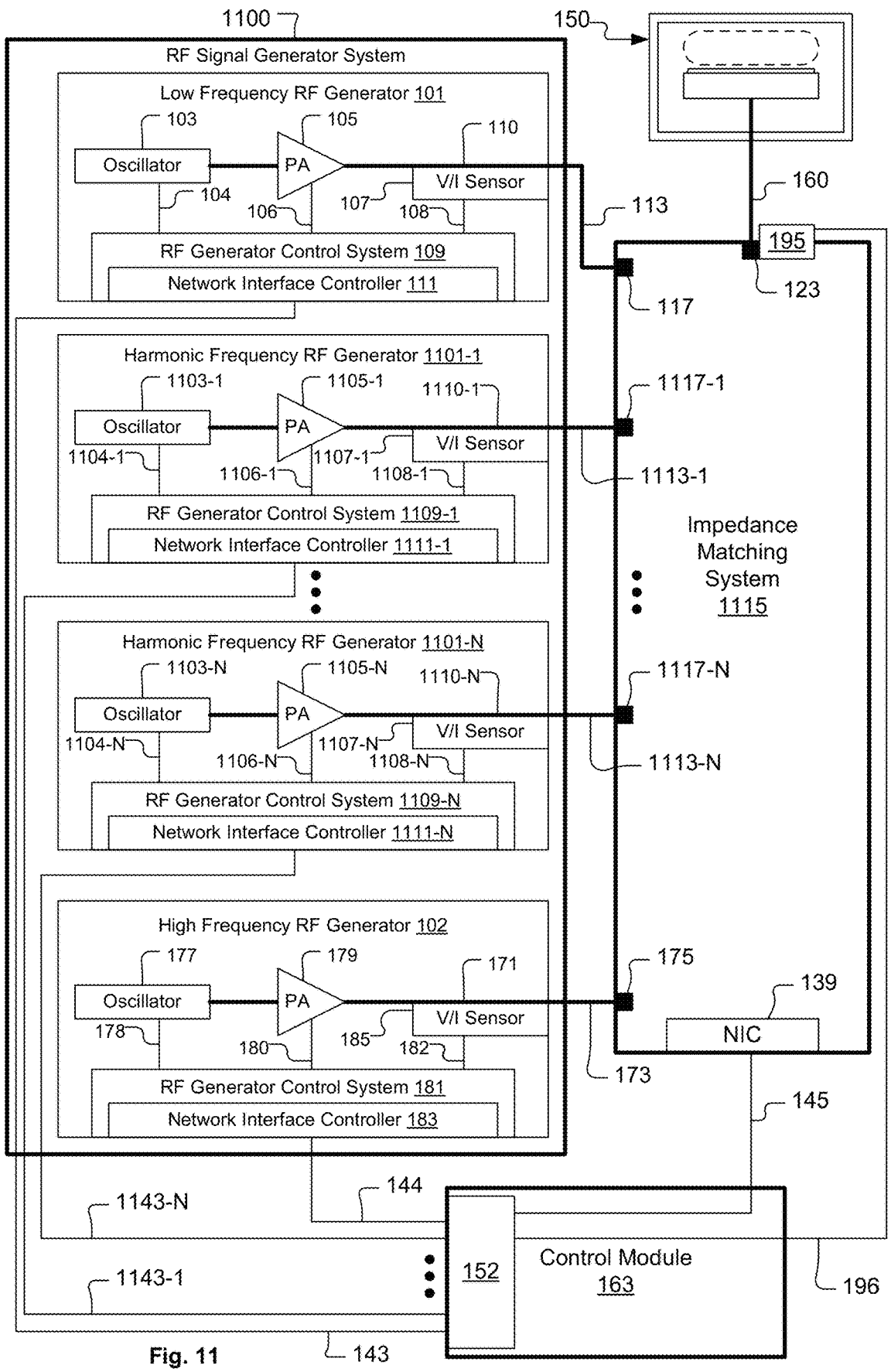
FIG. 11 shows an RF signal supply system that includes the low frequency RF signal generator and the high frequency RF signal generator, as described with regard to FIG. 1, and that further includes a plurality of harmonic frequency RF signal generators, in accordance with some embodiments.

FIG. 11 shows an RF signal supply system 1100 that includes the low frequency RF signal generator 101 and the high frequency RF signal generator 102, as described with regard to FIG. 1, and that further includes a plurality of harmonic frequency RF signal generators 1101-1 through 1101-N, in accordance with some embodiments. In some embodiments, the number (N) of harmonic frequency RF signal generators is two (N=2). However, in other embodiments, the number (N) of harmonic frequency signal RF generators is greater than two (N>2). Each harmonic frequency RF signal generator 1101-1 through 1101-N is set to generate an RF signal that is a particular harmonic frequency of the fundamental (base) low frequency RF signal generated by the low frequency RF signal generator 101. The harmonic frequency RF signals generated by the harmonic frequency RF signal generators 1101-1 through 1101-N are combined with the fundamental low frequency RF signal generated by the low frequency RF signal generator 101 in an impedance matching system 1115 to generate a composite low frequency RF signal waveform for use in the frequency tuning process of FIG. 2, such as the composite low frequency RF signal waveforms 702 and 802 as described above with regard to FIGS. 7 and 8, respectively.

Each of the harmonic frequency RF signal generators 1101-1 through 1101-N is configured in a similar manner as the low frequency RF signal generator 101. Each of the harmonic frequency RF signal generators 1101-1 through 1101-N includes an oscillator 1103-*x* for generating RF signals, where x is 1 to N. The oscillator 1103-*x* is an electronic circuit that produces a periodic oscillating electrical signal, such a sine wave electrical signal, having a specified frequency within the RF range. The oscillator 1103-*x* is capable of oscillating at a harmonic frequency of the operating frequency of the oscillator 103 of the low frequency RF signal generator 101. An output of the oscillator 1103-*x* is connected to an input of a power amplifier 1105-*x*, where x is 1 to N. The power amplifier 1105-*x* operates to amplify the RF signals generated by the oscillator 1103-*x*, and transmit the amplified RF signals through an output of the power amplifier 1105-*x* to the output 1110-*x* of the harmonic frequency RF signal generator 1101-*x*, where x is 1 to N.

Each harmonic frequency RF signal generator 1101-*x* also includes a control system 1109-*x*, where x is 1 to N, configured to provide for control of all operational aspects of the harmonic frequency RF signal generator 1101-*x*. In some embodiments, the control system 1109-*x* includes a processor, a data storage device, an input/output interface, and a data bus through which the processor, the data storage device, and the input/output interface communicate data to and from each other. The control system 1109-*x* is connected to provide for control of the oscillator 1103-*x*, as indicated by connection 1104-*x*, where x is 1 to N. The control system 109 is also connected to provide for control of the power amplifier 1105-*x*, as indicated by connection 1106-*x*, where x is 1 to N. The control system 1109-*x* also includes a NIC 1111-*x*, where x is 1 to N, that enables the control system 1109-*x* to send data to and receive data from systems outside of the harmonic frequency RF signal generator 1101-*x*. Examples of the NIC 1111-*x* include a network interface card, a network adapter, etc. In various embodiments, the NIC 1111-*x* is configured to operate in accordance with one or more network communication protocols and associate physical layers, such as Ethernet and/or EtherCAT, among others. Also, the control module 163 of the plasma processing system 150 is connected to the control system 1109-*x* of each harmonic frequency RF signal generator 1101-*x*, by way of the NIC 152 and the NIC 111-x, as indicated by connection 1143-*x*, where x is 1 to N.

It should be understood that the control system 1109-*x* is connected and configured to control essentially any aspect of the harmonic frequency RF signal generator 1101-*x*. And, it should be understood that the control system 1109-*x* can be connected and configured to monitor essentially any physical and/or electrical state, condition, and/or parameter at essentially any location within the harmonic frequency RF signal generator 1101-*x*. The control system 1109-*x* is also configured to direct operation of the harmonic frequency RF signal generator 1101-*x* in accordance with a prescribed algorithm. For example, the control system 1109-*x* is configured to operate the harmonic frequency RF signal generator 1101-*x* by executing input and control instructions/programs. The input and control instructions/programs include a target RF power setpoint and a target frequency setpoint, among other parameters associated with operation and control of the harmonic frequency RF signal generator 1101-*x*.

In some embodiments, the control system 1109-*x* of each harmonic frequency RF signal generator 1101-*x* is connected to the control system 109 of the low frequency RF signal generator 101, such that the each harmonic frequency RF signal generator 1101-*x* operates as a slave system to the low frequency RF signal generator 101, which operates as a master system.

The harmonic frequency RF signal generator 1101-*x* also includes a voltage/current (V/I) sensor 1107-*x*, where x is 1 to N, connected to the output 1110-*x* of the harmonic frequency RF signal generator 1101-*x*. The V/I sensor 1107-*x* is connected to the control system 1109-*x*, as shown by connection 1108-*x*, where x is 1 to N. In this configuration, the V/I sensor 1107-*x* provides a real-time measurement of voltage and current present on the output 1110-*x* of the harmonic frequency RF signal generator 1101-*x* to the control system 1109-*x*. In some embodiments, the V/I sensor 1107-*x* is disposed within the harmonic frequency RF signal generator 1101-*x*.

Each harmonic frequency RF signal generator 1101-*x* is configured to generate and transmit harmonic frequency RF signals of controlled amplitude and frequency from the output 1110-*x* of the harmonic frequency RF signal generator 1101-*x*, through/along a corresponding electrical conductor 1113-*x*, to a corresponding input 1117-*x* of the impedance matching system 1115, where x is 1 to N. The impedance matching system combines the harmonic frequency RF signals generated by the harmonic frequency RF signal generators 1101-*x* with the fundamental low frequency RF signal generated by the low frequency RF signal generator 101 to generate the composite low frequency RF signal waveform, which travels from the output 123 of the impedance matching system 115, through/along the RF feed structure 160, to the electrode or antenna within the plasma processing system 150.

Figure 12:
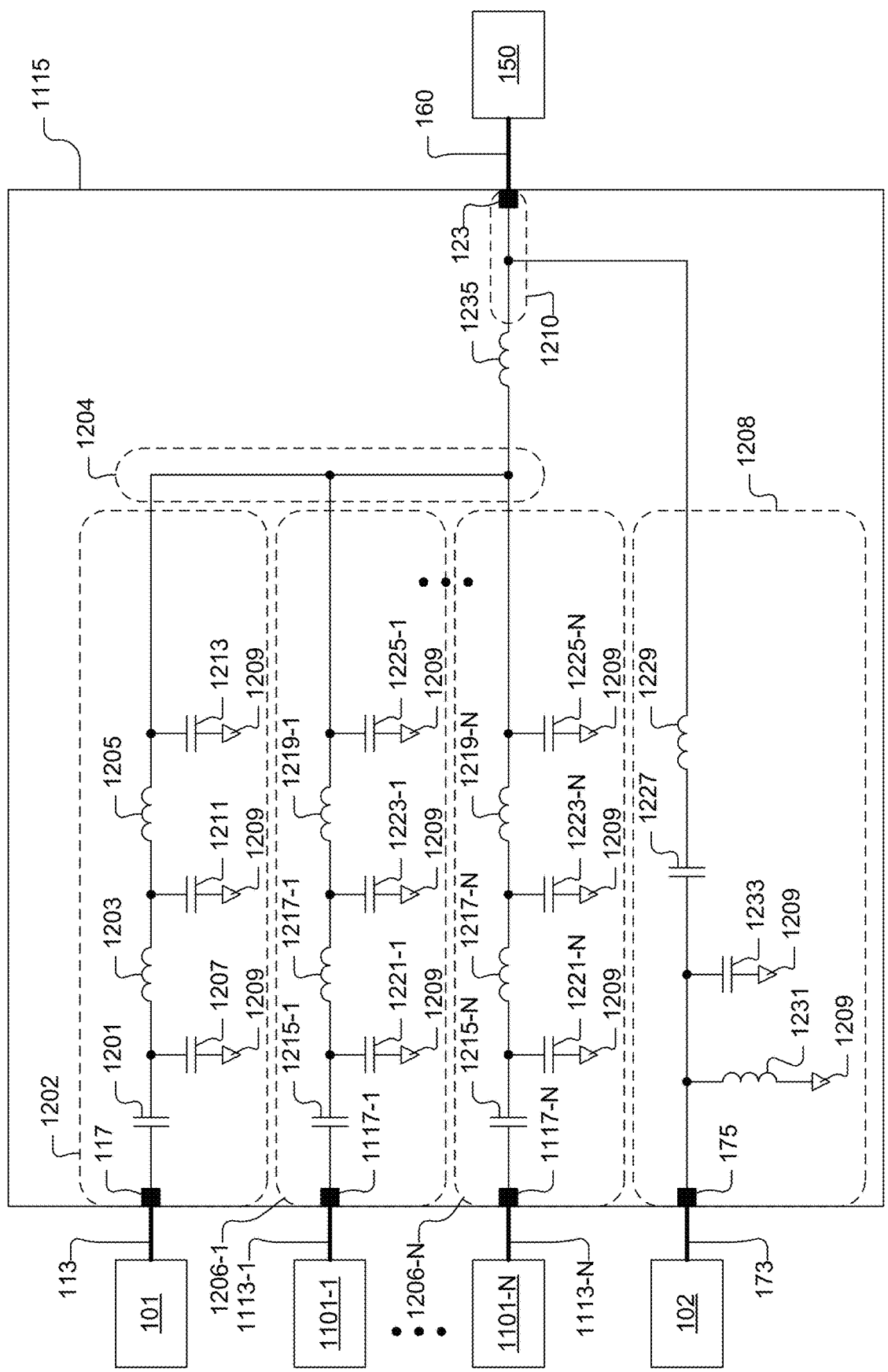
FIG. 12 shows an example configuration of the impedance matching system, in accordance with some embodiments.

FIG. 12 shows an example configuration of the impedance matching system 1115, in accordance with some embodiments. The input 117 through which the fundamental (base) frequency RF signal is transmitted from low frequency RF signal generator 101 is connected to an impedance control circuit 1202 that includes a capacitor 1201, an inductor 1203, an inductor 1205, a capacitor 1207, a capacitor 1211, and a capacitor 1213. The input 117 is connected to a first terminal of the capacitor 1201. A second terminal of the capacitor 1201 is connected to a first terminal of the inductor 1203. A second terminal of the inductor 1203 is connected to a first terminal of the inductor 1205. A second terminal of the inductor 1205 is connected to a pre-output node 1204. Also, a first terminal of the capacitor 1207 is connected to both the second terminal of the capacitor 1201 and the first terminal of the inductor 1203. A second terminal of the capacitor 1207 is connected to a reference ground potential 1209. A first terminal of the capacitor 1211 is connected to both the second terminal of the inductor 1203 and the first terminal of the inductor 1205. A second terminal of the capacitor 1211 is connected to the reference ground potential 1209. A first terminal of the capacitor 1213 is connected to both the second terminal of the inductor 1205 and the pre-output node 1204. A second terminal of the capacitor 1213 is connected to the reference ground potential 1209.

The input 1117-1 through which the harmonic frequency RF signal is transmitted from harmonic frequency RF signal generator 1101-1 is connected to an impedance control circuit 1206-1 that includes a capacitor 1215-1, an inductor 1217-1, an inductor 1219-1, a capacitor 1221-1, a capacitor 1223-1, and a capacitor 1225-1. The input 1117-1 is connected to a first terminal of the capacitor 1215-1. A second terminal of the capacitor 1215-1 is connected to a first terminal of the inductor 1217-1. A second terminal of the inductor 1217-1 is connected to a first terminal of the inductor 1219-1. A second terminal of the inductor 1219-1 is connected to the pre-output node 1204. Also, a first terminal of the capacitor 1221-1 is connected to both the second terminal of the capacitor 1215-1 and the first terminal of the inductor 1217-1. A second terminal of the capacitor 1221-1 is connected to the reference ground potential 1209. A first terminal of the capacitor 1223-1 is connected to both the second terminal of the inductor 1217-1 and the first terminal of the inductor 1219-1. A second terminal of the capacitor 1223-1 is connected to the reference ground potential 1209. A first terminal of the capacitor 1225-1 is connected to both the second terminal of the inductor 1219-1 and the pre-output node 1204. A second terminal of the capacitor 1225-1 is connected to the reference ground potential 1209.

In some embodiments, each input 1117-1 through 1117-N of the impedance matching system 1115 through which a given harmonic frequency RF signal is transmitted from a corresponding harmonic frequency RF signal generator 1101-1 through 1101-N is connected to a corresponding impedance control circuit 1206-1 through 1206-N that is configured like the impedance control circuit 1206-1. In this manner, the input 1117-N through which the harmonic frequency RF signal is transmitted from Nth harmonic frequency RF signal generator 1101-N is connected to an impedance control circuit 1206-N that includes a capacitor 1215-N, an inductor 1217-N, an inductor 1219-N, a capacitor 1221-N, a capacitor 1223-N, and a capacitor 1225-N. The input 1117-N is connected to a first terminal of the capacitor 1215-N. A second terminal of the capacitor 1215-N is connected to a first terminal of the inductor 1217-N. A second terminal of the inductor 1217-N is connected to a first terminal of the inductor 1219-N. A second terminal of the inductor 1219-N is connected to the pre-output node 1204. Also, a first terminal of the capacitor 1221-N is connected to both the second terminal of the capacitor 1215-N and the first terminal of the inductor 1217-N. A second terminal of the capacitor 1221-N is connected to the reference ground potential 1209. A first terminal of the capacitor 1223-N is connected to both the second terminal of the inductor 1217-N and the first terminal of the inductor 1219-N. A second terminal of the capacitor 1223-N is connected to the reference ground potential 1209. A first terminal of the capacitor 1225-N is connected to both the second terminal of the inductor 1219-N and the pre-output node 1204. A second terminal of the capacitor 1225-N is connected to the reference ground potential 1209.

The input 175 through which the high frequency RF signal is transmitted from high frequency RF signal generator 102 is connected to an impedance control circuit 1208 that includes a capacitor 1227, an inductor 1229, an inductor 1231, and a capacitor 1233. The input 175 is connected to a first terminal of the capacitor 1227. A second terminal of the capacitor 1227 is connected to a first terminal of the inductor 1229. A second terminal of the inductor 1229 is connected to a final-output node 1210. Also, a first terminal of the inductor 1231 is connected to each of the input 175, the first terminal of the capacitor 1227, and first terminal of the capacitor 1233. A second terminal of the inductor 1231 is connected to the reference ground potential 1209. The first terminal of the capacitor 1233 is connected to each of the input 175, the first terminal of the inductor 1231 and the first terminal of the capacitor 1227. A second terminal of the capacitor 1233 is connected to the reference ground potential 1209.

The pre-output node 1204 is connected to a first terminal of an output inductor 1235. A second terminal of the output inductor 1235 is connected to the final-output node 1210. The final-output node is connected to the output 123 of the impedance matching system 1115, which is connected to the RF feed structure 160 of the plasma processing system 150. In some embodiments, voltage and/or current measurements of the composite low frequency RF signal waveform are taken at the pre-output node 1204. In these embodiments, the output inductor 1235 is provided to prevent the high frequency RF signals at the final-output node 1210 from interfering with the voltage and/or current measurements taken at the pre-output node 1204. It should be understood that the configuration of the impedance matching system 1115 as shown in FIG. 12 is provided by way of example. In other embodiments, the impedance matching system 1115 can be configured in different ways, with different combinations of capacitors and inductors, so as to ensure that impedance seen at the output 110 of the low frequency RF signal generator 101 is substantially close to a design basis operating impedance, and so that the impedances seen at each output 1110-$x$ of the harmonic frequency RF signal generators 1101-$x$ is substantially close to a design basis operating impedance, and so that the impedance seen at the output 171 of the high frequency RF signal generator 102 is substantially close to a design basis operating impedance.

Using the harmonic frequency RF signal generators 1101-1 through 1101-N it is possible to manipulate the frequency and phase of the harmonic frequency RF signals that are combined with the fundamental (base) frequency RF signal to generate a particular composite low frequency RF signal waveform that serves to advantageously influence the portion of the plasma sheath where the plasma potential collapses so as to maintain and/or improve coupling of the high frequency RF signal to the plasma and thereby reduce corresponding plasma process result non-uniformity across the substrate. It should be understood that each of the harmonic frequency RF signal generators 1101-1 through 1101-N can be independently controlled to enable control of both the phase difference and the voltage difference between each harmonic frequency RF signal and the fundamental (base) low frequency RF signal. Also, while the examples of FIGS. 7 and 8 demonstrate combination of the first (fundamental), third, and fifth harmonics to generate the composite low frequency RF signal waveform, it should be understood that in various embodiments essentially any combination of two or more harmonics can be combined with the first (fundamental) harmonic to generate a composite low frequency RF signal waveform having particular characteristics. In some embodiments, the composite low frequency RF signal waveform can be generated to provide for a higher plasma sheath potential than what is achievable from using a sinusoidal low frequency RF signal at a same power level.

Figure 13A:
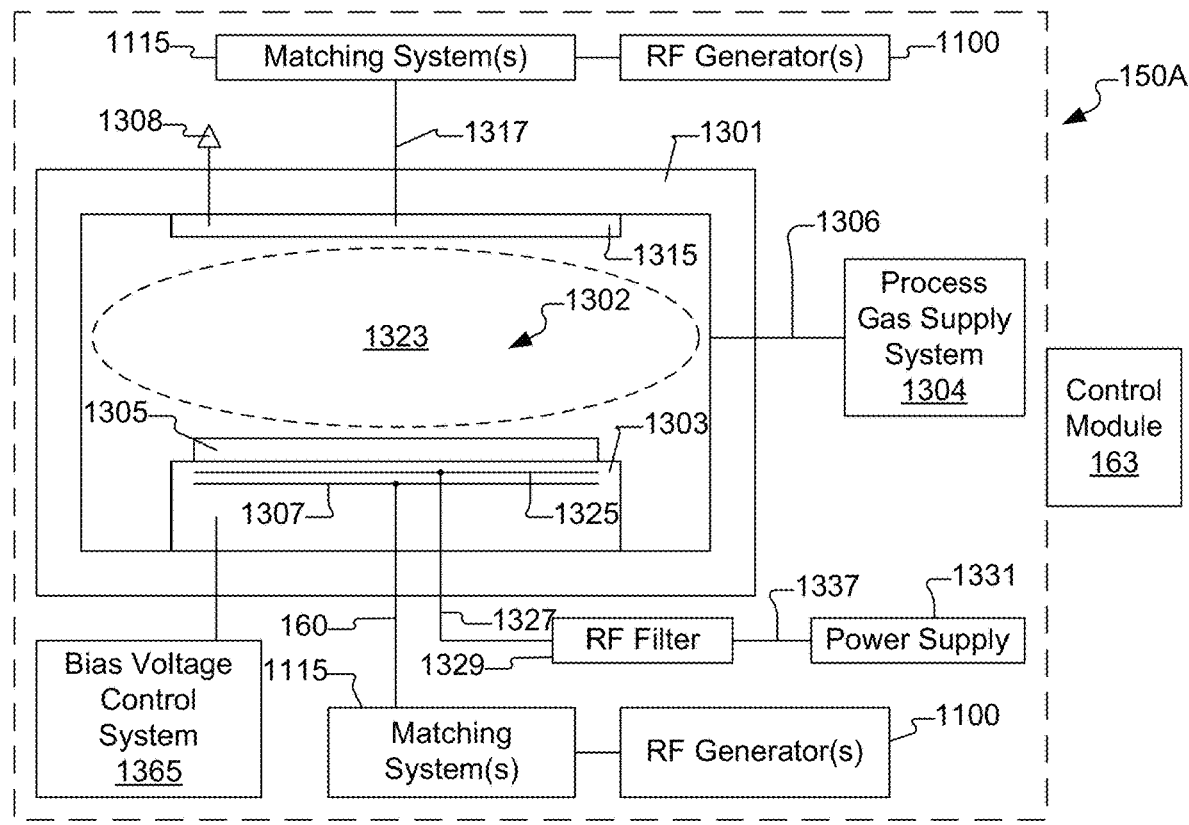
FIG. 13A shows an example diagram of a CCP processing system, in accordance with some embodiments of the present disclosure.

As previously mentioned, in various embodiments, the plasma processing system 150 is either a CCP processing system or an ICP processing system. FIG. 13A shows an example vertical cross-section diagram of a CCP processing system 150A, in accordance with some embodiments of the present disclosure. The CCP processing system 150A includes a chamber 1301 within which a plasma processing region 1302 exists. Within the plasma processing region 1302, a plasma 1323 (represented by the dashed oval region) is generated in exposure to a substrate 1305 to affect a change to the substrate 1305 in a controlled manner. In various fabrication processes, the change to the substrate 1305 can be a change in material or surface condition on the substrate 1305. For example, in various fabrication processes, the change to the substrate 1305 can include one or more of etching of a material from the substrate 1305, deposition of a material on the substrate 1305, or modification of material present on the substrate 1305. In some embodiments, the substrate 1305 is a semiconductor wafer undergoing a fabrication procedure. However, it should be understood that in various embodiments, the substrate 1305 can be essentially any type of substrate that is subjected to a plasma-based fabrication process. For example, in some embodiments, the substrate 1305 as referred to herein can be a substrate formed of silicon, sapphire, GaN, GaAs or SiC, or other substrate materials, and can include glass panels/substrates, metal foils, metal sheets, polymer materials, or the like. Also, in various embodiments, the substrate 1305 as referred to herein may vary in form, shape, and/or size. For example, in some embodiments, the substrate 1305 referred to herein may correspond to a 200 mm (millimeters) diameter semiconductor wafer, a 300 mm diameter semiconductor wafer, or a 450 mm diameter semiconductor wafer, among other semiconductor wafer sizes. Also, in some embodiments, the substrate 1305 referred to herein may correspond to a non-circular substrate, such as a rectangular substrate for a flat panel display, or the like, among other shapes.

The plasma processing region 1302 within the CCP processing chamber 1301 is connected to a process gas supply system 1304, such that one or more process gas(es) can be supplied in a controlled manner to the plasma processing region 1302, as represented by line 1306. It should be understood that the process gas supply system 1304 includes one or more process gas sources and an arrangement of valves and mass flow controllers to enable provision of the one or more process gas(es) to the plasma processing region 1302 with a controlled flow rate and with a controlled flow time. Also, in various embodiments, the one or more process gas(es) are delivered to the plasma processing region 1302 in both a temporally controlled manner and a spatially controlled manner relative to the substrate 1305. In various embodiments, the CCP processing system 150A operates by having the process gas supply system 1304 deliver one or more process gases into the plasma processing region 1302, and by applying RF power to the one or more process gases to transform the one or more process gases into the plasma 1323 in exposure to the substrate 1305, in order to cause a change in material or surface condition on the substrate 1305.

The CCP processing chamber 1301 includes a substrate support structure 1303 upon which the substrate 1305 is positioned and supported during processing operations. In some embodiments, an electrode 1307 is disposed within the substrate support structure 1303 to provide for transmission of RF power from the electrode 1307 through the plasma processing region 1302 to generate the plasma 1323 and/or control ion energy. The electrode 1307 is connected to receive RF power through the RF feed structure 160, which is connected to the RF signal supply system 1100 by way of the impedance matching system 1115. The RF feed structure 160 is an electrically conductive member. In some embodiments, the RF feed structure 160 includes an electrically conductive rod. The impedance matching system 1115 includes an arrangement of capacitors and inductors configured to ensure that the impedances seen at the outputs of the RF signal generators 101, 102, and 1101-1 through 1101-N within the RF signal supply system 1100 are sufficiently close to design basis impedances for which the RF signal generators are designed to operate (usually 50 Ohm), so that RF power generated and transmitted by the RF signal generators 101, 102, and 1101-1 through 1101-N will be transmitted into the plasma processing region 1302 as efficiently as possible, e.g., with minimum possible reflection.

Also, in some embodiments, the CCP processing chamber 1301 can include an upper electrode 1315. In various embodiments, the upper electrode 1315 can provide either an electrical ground electrode or can be used to transmit RF power into the plasma processing region 1302. For example, in some embodiments, the upper electrode 1315 is connected to a reference ground potential 1308, such that the upper electrode 1315 provides a return path for RF signals transmitted into the plasma processing region 1302 from the electrode 1307. Alternatively, in some embodiments, the upper electrode 1315 is connected to receive RF power through an RF feed structure 1317, which is connected to an instance of the RF signal supply system 1100 by way of an instance of the impedance matching system 1115.

In some embodiments, a heater assembly 1325 is disposed within the substrate support structure 1303 to provide temperature control of the substrate 1305. The heater assembly 1325 is electrically connected to receive electrical power through an electrical connection 1327, where the electrical power is supplied from a power supply 1331 through an electrical connection 1337 to an RF filter 1329, and through the RF filter 1329 to the electrical connection 1327. In some embodiments, the power supply 1331 is an alternating current (AC) power supply. In some embodiments, the power supply 1331 is a direct current (DC) power supply. In some embodiments, the heater assembly 1325 includes a plurality of electrical resistance heating elements. The RF filter 1329 is configured to prevent RF power from entering the power supply 1331, while allowing transmission of electrical current between the power supply 1331 and the electrical connection 1327.

Also, in some embodiments, a bias voltage control system 1365 is connected to the substrate support structure 1303 within the CCP processing chamber 1301. In some embodiments, the bias voltage control system 1365 is connected to one or more bias voltage electrodes disposed within the substrate support structure 1303 to control a bias voltage present at the location of the substrate 1305. The bias voltage can be controlled to attract charged constituents of the plasma 1323 toward the substrate 1305 and thereby control energy and directionality of the charged constituents of the plasma 1323. For example, the bias voltage control system 1365 can be operated to accelerate ions in the plasma 1323 toward the substrate 1305 to perform an anisotropic etch on the substrate 1305.

Figure 13B:
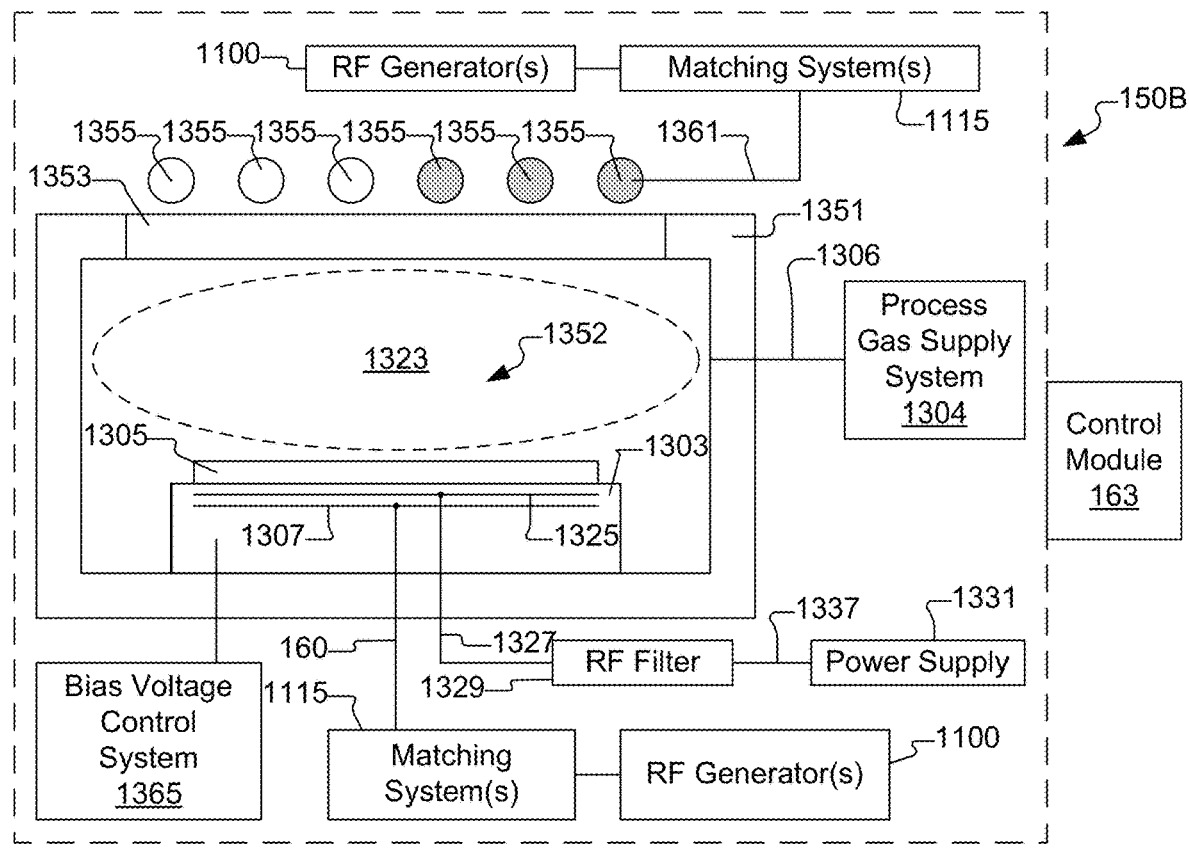
FIG. 13B shows an example diagram of an ICP processing system, in accordance with some embodiments of the present disclosure.

FIG. 13B shows an example vertical cross-section diagram of an ICP processing system 150B, in accordance with some embodiments of the present disclosure. The ICP processing system 150B can also be referred to as a transformer coupled plasma (TCP) processing system. For ease of discussion herein, ICP processing system will be used to refer to both ICP and TCP processing systems. The ICP processing system 150B includes a chamber 1351 within which a plasma processing region 1352 exists. Within the plasma processing region 1352, the plasma 1323 (represented by the dashed oval region) is generated in exposure to the substrate 1305 to affect a change to the substrate 1305 in a controlled manner. In various fabrication processes, the change to the substrate 1305 can be a change in material or surface condition on the substrate 1305. For example, in various fabrication processes, the change to the substrate 1305 can include one or more of etching of a material from the substrate 1305, deposition of a material on the substrate 1305, or modification of material present on the substrate 1305. It should be understood that the ICP processing chamber 1351 can be any type of ICP processing chamber in which RF power is transmitted from a coil 1355 disposed outside the ICP processing chamber 1351 to a process gas within the ICP processing chamber 1351 to generate the plasma 1323 within the plasma processing region 1352. An upper window structure 1353 is provided to allow for transmission of RF power from the coil 1355 through the upper window structure 1353 and into the plasma processing region 1352 of the ICP processing chamber 1351.

The plasma processing region 1352 within the ICP processing chamber 1351 is connected to the process gas supply system 1304, such that one or more process gas(es) can be supplied in a controlled manner to the plasma processing region 1352, as represented by line 1306. The ICP processing system 150B operates by having the process gas supply system 1304 flow one or more process gases into the plasma processing region 1352, and by applying RF power from the coil 1355 to the one or more process gases to transform the one or more process gases into the plasma 1323 in exposure to the substrate 1305, in order to cause a change in material or surface condition on the substrate 1305.

Figure 13C:
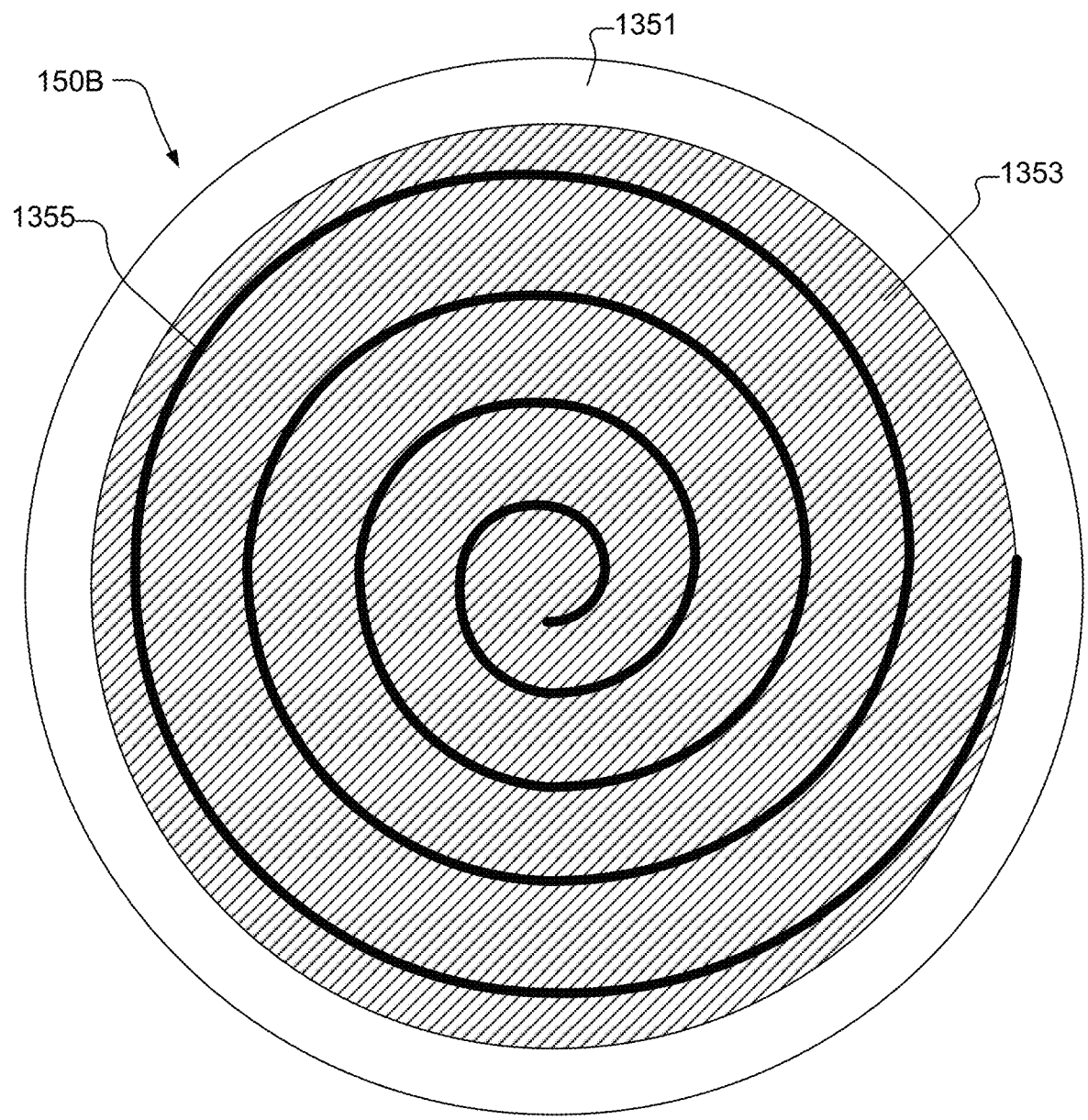
FIG. 13C shows a top view of the coil, in accordance with some embodiments.

The coil 1355 is disposed above the upper window structure 1353. In the example of FIG. 13B, the coil 1355 is formed as a radial coil assembly, with the shaded parts of the coil 1355 turning into the page of the drawing and with the unshaded parts of the coil 1355 turning out of the page of the drawing. FIG. 13C shows a top view of the coil 1355, in accordance with some embodiments. It should be understood, however, that in other embodiments the coil 1355 can have essentially any configuration that is suitable for transmitting RF power through the upper window structure 1353 and into the plasma processing region 1352. In various embodiments, the coil 1355 can have any number of turns and any cross-section size and shape (circular, oval, rectangular, trapezoidal, etc.) as appropriate to provide the desired transmission of RF power through the upper window structure 1353 into the plasma processing region 1352. In some embodiments, the coil 1355 is connected through an RF power supply structure 1361 to an instance of the RF signal supply system 1100 by way of impedance matching system 1115. Also, in some embodiments, the ICP processing chamber 1351 can include the electrode 1307, the RF feed structure 160, the impedance matching system 1115, and the RF signal supply system 110, as previously described with regard to FIG. 13A.

Also, in some embodiments, the ICP processing chamber 1351 can include the heater assembly 1325 disposed within the substrate support structure 1303 to provide temperature control of the substrate 1305. As described with regard to the CCP processing chamber 1301 of FIG. 13A, the heater assembly 1325 of the ICP processing chamber 1351 is electrically connected to receive electrical power through the electrical connection 1327, where the electrical power is supplied from the power supply 1331 through the electrical connection 1337 to the RF filter 1329, and through the RF filter 1329 to the electrical connection 1327. Also, in some embodiments, the bias voltage control system 1365 is connected to the substrate support structure 1303 within the ICP processing chamber 1351.

The control module 163 is configured and connected to provide for control of plasma process operations performed by the CCP processing system 150A and by the ICP processing system 150B. In some embodiments, the control module 163 is implemented as a combination of computer hardware and software. The control module 163 can be configured and connected to provide for control of essentially any system or component associated with the CCP processing system 150A and/or the ICP processing system 150B. For example, the control module 163 can be configured and connected to control the process gas supply system 1304, the RF signal supply system 1100, the impedance matching system 1115, the power supply 1331 for the heater assembly 1325, the bias voltage control system 1365, and/or any other system or component.

Also, the control module 163 can be connected and configured to receive signals from various components, sensors, and monitoring devices associated with the CCP processing system 150A and the ICP processing system 150B. For example, the control module 163 can be connected and configured to receive electrical measurement signals, e.g., voltage and/or current, and RF measurement signals from one or more of the substrate support structure 1303, the RF feed structure 160, the RF feed structure 1317, the RF feed structure 1361, the electrical connection 1327, and from any other structure or component within the CCP processing system 150A and the ICP processing system 150B. And, the control module 163 can be connected and configured to receive temperature and pressure measurement signals from within the plasma processing regions 1302 and 1352 of the CCP processing chamber 1301 and the ICP processing chamber 1351, respectively. Also, in some embodiments, the control module 163 can be configured and connected to receive, process, and respond to an optically measured signal within the CCP processing chamber 1301 and the ICP processing chamber 1351.

It should be understood that the control module 163 can be connected and configured to control essentially any active device, i.e., controllable device, associated with operation of the CCP processing system 150A and the ICP processing system 150B. And, it should be understood that the control module 163 can be connected and configured to monitor essentially any physical and/or electrical state, condition, and/or parameter at essentially any location within the CCP processing system 150A and the ICP processing system 150B. The control module 163 can also be configured to direct operation of various components in a synchronous and scheduled manner to perform a prescribed plasma processing operation on the substrate 1305. For example, the control module 163 can be configured to operate the CCP processing system 150A and the ICP processing system 150B by executing process input and control instructions/programs. The process input and control instructions/programs may include process recipes having time-dependent directions for parameters such as power levels, timing parameters, process gases, mechanical movement of the substrate 1305, etc., as needed to obtain a desired process result on the substrate 1305. In some embodiments, the control module 163 is programmed to direct operation of the CCP processing system 150A and/or the ICP processing system 150B in accordance with the frequency tuning process of FIG. 2.

Figure 13D:
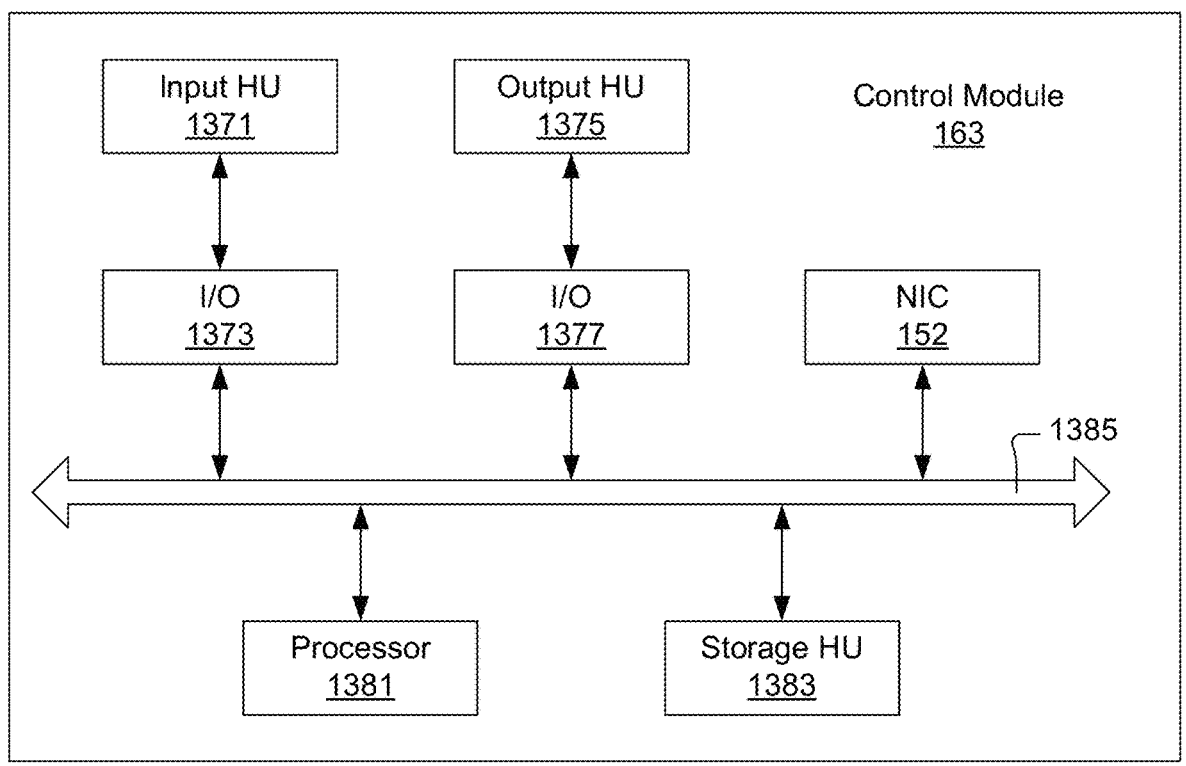
FIG. 13D shows a diagram of the control module, in accordance with some example embodiments.

FIG. 13D shows a diagram of the control module 163, in accordance with some example embodiments. The control module 163 includes a processor 1381, a storage hardware unit (HU) 1383 (e.g., memory), an input HU 1371, an output RU 1375, an input/output (I/O) interface 1373, an I/O interface 1377, the NIC 152, and a data communication bus 1385. The processor 1381, the storage HU 1383, the input HU 1371, the output HU 1375, the I/O interface 1373, the I/O interface 1377, and the NIC 152 are in data communication with each other by way of the data communication bus 1385. Examples of the input HU 1371 include a mouse, a keyboard, a stylus, a data acquisition system, a data acquisition card, etc. Examples of the output HU 1375 include a display, a speaker, a device controller, etc. Examples of the NIC 152 include a network interface card, a network adapter, etc. In various embodiments, the NIC 152 is configured to operate in accordance with one or more communication protocols and associate physical layers, such as Ethernet and/or EtherCAT, among others. Each of the UO interfaces 1373 and 1377 is defined to provide compatibility between different hardware units coupled to the I/O interface. For example, the I/O interface 1373 can be defined to convert a signal received from the input HU 1371 into a form, amplitude, and/or speed compatible with the data communication bus 1385. Also, the I/O interface 1377 can be defined to convert a signal received from the data communication bus 1385 into a form, amplitude, and/or speed compatible with the output HU 1375. Although various operations described herein are performed by the processor 1381 of the control module 163, it should be understood that in some embodiments various operations can be performed by multiple processors of the control module 163 and/or by multiple processors of multiple computing systems connected to the control module 163.

An RF signal supply system (1100) for a plasma processing system (150) is disclosed herein. The RF signal supply system (1100) includes a first RF signal generator (101) set to generate a first RF signal having a first frequency ($LF_1$) at an output (110) of the first RF signal generator (101). The RF signal supply system (1100) also includes a second RF signal generator (1101-1) set to generate a second RF signal having a second frequency ($LF_2$) at an output (1110-1) of the second RF signal generator (1101-1). The second frequency ($LF_2$) is a specified harmonic of the first frequency ($LF_1$), i.e., $LF_2 \approx (LF_1*n)$, where n is an integer greater than 1. The RF signal supply system (1100) also includes a third RF signal generator (1101-2) set to generate a third RF signal having a third frequency ($LF_3$) at an output (1110-2) of the third RF signal generator (1101-2). The third frequency ($LF_3$) is a specified harmonic of the first frequency ($LF_1$), i.e., $LF_3 \approx (LF_1*n)$, where n is an integer greater than 1. And, the third frequency ($LF_3$) and the second frequency ($LF_2$) are different specified harmonics of the first frequency ($LF_1$). The RF signal supply system (1100) also includes a fourth RF signal generator (102) set to generate a fourth RF signal having a fourth frequency (HF) at an output (171) of the fourth RF signal generator (102). The fourth frequency (HF) is at least two orders of magnitude larger than the first frequency ($LF_1$).

The RF signal supply system (1100) also includes an impedance matching system (1115) having a first input (117) connected to the output (110) of the first RF signal generator (101), and a second input (1117-1) connected to the output (1110-1) of the second RF signal generator (1101-1), and a third input (1117-2) connected to the output (1110-2) of the third RF signal generator (1101-2), and a fourth input (175) connected to the output (171) of the fourth RF signal generator (102). The impedance matching system (1115) has an output (123) connected to an RF supply input (160) of the plasma processing system (150). The impedance matching system (1115) is configured to control impedances at the output (110) of the first RF signal generator (101), and at the output (1110-1) of the second RF signal generator (1101-1), and at the output (1110-2) of the third RF signal generator (1101-2), and at the output (171) of the fourth RF signal generator (102).

The RF signal supply system (1100) also includes a control module (163) programmed to control a first phase difference ($\Delta\phi_1$) between the second RF signal having the second frequency ($LF_2$) and the first RF signal having the first frequency ($LF_1$). The control module (163) is also programmed to control a second phase difference ($\Delta\phi_2$) between the third RF signal having the third frequency ($LF_3$) and the first RF signal having the first frequency ($LF_1$). The control module (163) is also programmed to control a first voltage difference ($\Delta V_1$) between the second RF signal having the second frequency ($LF_2$) and the first RF signal having the first frequency ($LF_1$). The control module (163) is also programmed to control a second voltage difference ($\Delta V_2$) between the third RF signal having the third frequency ($LF_3$) and the first RF signal having the first frequency ($LF_1$). The first phase difference ($\Delta\phi_1$), and the second phase difference ($\Delta\phi_2$), and the first voltage difference ($\Delta V_1$), and the second voltage difference ($\Delta V_2$) are set to collectively control a plasma sheath voltage/potential as a function of time within the plasma processing system (150) and correspondingly control a process result uniformity across a substrate (1305) within the plasma processing system (150).

In some embodiments, the first frequency ($LF_1$) is within a range extending from about 330 kHz to about 440 kHz, and the fourth frequency (HF) is within a range extending from about 57 MHz to about 63 MHz. In some embodiments, the first frequency ($LF_1$) is about 400 kHz, and the second frequency ($LF_2$) is about 1.2 MHz, and the third frequency ($LF_3$) is about 2.0 MHz, and the fourth frequency (HF) is about 60 MHz. In some embodiments, the first phase difference ($\Delta\phi_1$) is about thirty degrees, and the second phase difference ($\Delta\phi_2$) is about thirty degrees. In some embodiments, the first voltage difference ($\Delta V_1$) is set so that a power of the second RF signal having the second frequency ($LF_2$) is within a range extending from about 17% to about 20% of a power of the first RF signal having the frequency ($LF_1$), and the second voltage difference ($\Delta V_2$) is set so that a power of the third RF signal having the frequency ($LF_3$) is within a range extending from about 5% to about 8% of a power of the first RF signal having the frequency ($LF_1$). In some embodiments, each of the second frequency ($LF_2$) and third frequency ($LF_3$) is a respective integer multiple greater than one of the first frequency ($LF_1$).

In some embodiments, the second RF signal generator (1101-1) is connected as a slave of the first RF signal generator (101) so that the second frequency ($LF_2$) tracks in real-time as an integer multiple of the first frequency ($LF_1$), and so that the first phase difference ($\Delta\phi_1$) between the second RF signal having the second frequency ($LF_2$) and the first RF signal having the first frequency ($LF_1$) is maintained in real-time. Also, in these embodiments, the third RF signal generator (1101-2) is connected as a slave of the first RF signal generator (101) so that the third frequency ($LF_3$) tracks in real-time as an integer multiple of the first frequency ($LF_1$), and so that the second phase difference ($\Delta\phi_2$) between the third RF signal having the third frequency ($LF_3$) and the first RF signal having the first frequency ($LF_1$) is maintained in real-time.

In some embodiments, the first phase difference ($\Delta\phi_1$), and the first voltage difference ($\Delta V_1$), and the second phase difference ($\Delta\phi_2$), and the second voltage difference ($\Delta V_2$) are collectively set to control an etch rate uniformity across a substrate (1305) within the plasma processing system (150). In some embodiments, the first phase difference ($\Delta\phi_1$), and the first voltage difference ($\Delta V_1$), and the second phase difference ($\Delta\phi_2$), and the second voltage difference ($\Delta V_2$) are collectively set to increase a plasma sheath voltage/potential over a larger percentage of a cycle of the first RF signal having the first frequency ($LF_1$). In some embodiments, the first phase difference ($\Delta\phi_1$), and the first voltage difference ($\Delta V_1$), and the second phase difference ($\Delta\phi_2$), and the second voltage difference ($\Delta V_2$) are collectively set to generate a substantially square cyclical waveform as a combination of the first RF signal having the first frequency ($LF_1$), and the second RF signal having the second frequency ($LF_2$) and the third RF signal having the third frequency ($LF_3$). In some embodiments, the first phase difference ($\Delta\phi_1$), and the first voltage difference ($\Delta V_1$), and the second phase difference ($\Delta\phi_2$), and the second voltage difference ($\Delta V_2$) are collectively set to provide a larger maximum plasma sheath voltage/potential than what is achievable from just the first RF signal having the first frequency ($LF_1$). In some embodiments, the first RF signal having the first frequency ($LF_1$), and the second RF signal having the second frequency ($LF_2$), and the third RF signal having the third frequency ($LF_3$) combine to form a cyclical waveform, where each cycle of the cyclical waveform has a negative half and a positive half, and where the first phase difference ($\Delta\phi_1$), and the first voltage difference ($\Delta V_1$), and the second phase difference ($\Delta\phi_2$), and the second voltage difference ($\Delta V_2$) are collectively set so that the negative half of each cycle of the cyclical waveform is longer than the positive half of each cycle of the cyclical waveform.

In some embodiments, the impedance matching system (1115) includes a first impedance control circuit (1202) connected between the first input (117) of the impedance matching system (1115) and the output (123) of the impedance matching system (1115). And, the impedance matching system (1115) includes a second impedance control circuit (1206-1) connected between the second input (1117-1) of the impedance matching system (1115) and the output (123) of the impedance matching system (1115). And, the impedance matching system (1115) includes a third impedance control circuit (1206-2) connected between the third input (1117-2) of the impedance matching system (1115) and the output (123) of the impedance matching system (1115). And, the impedance matching system (1115) includes a fourth impedance control circuit (1208) connected between the fourth input (175) of the impedance matching system (1115) and the output (123) of the impedance matching system (1115).

Figure 14:
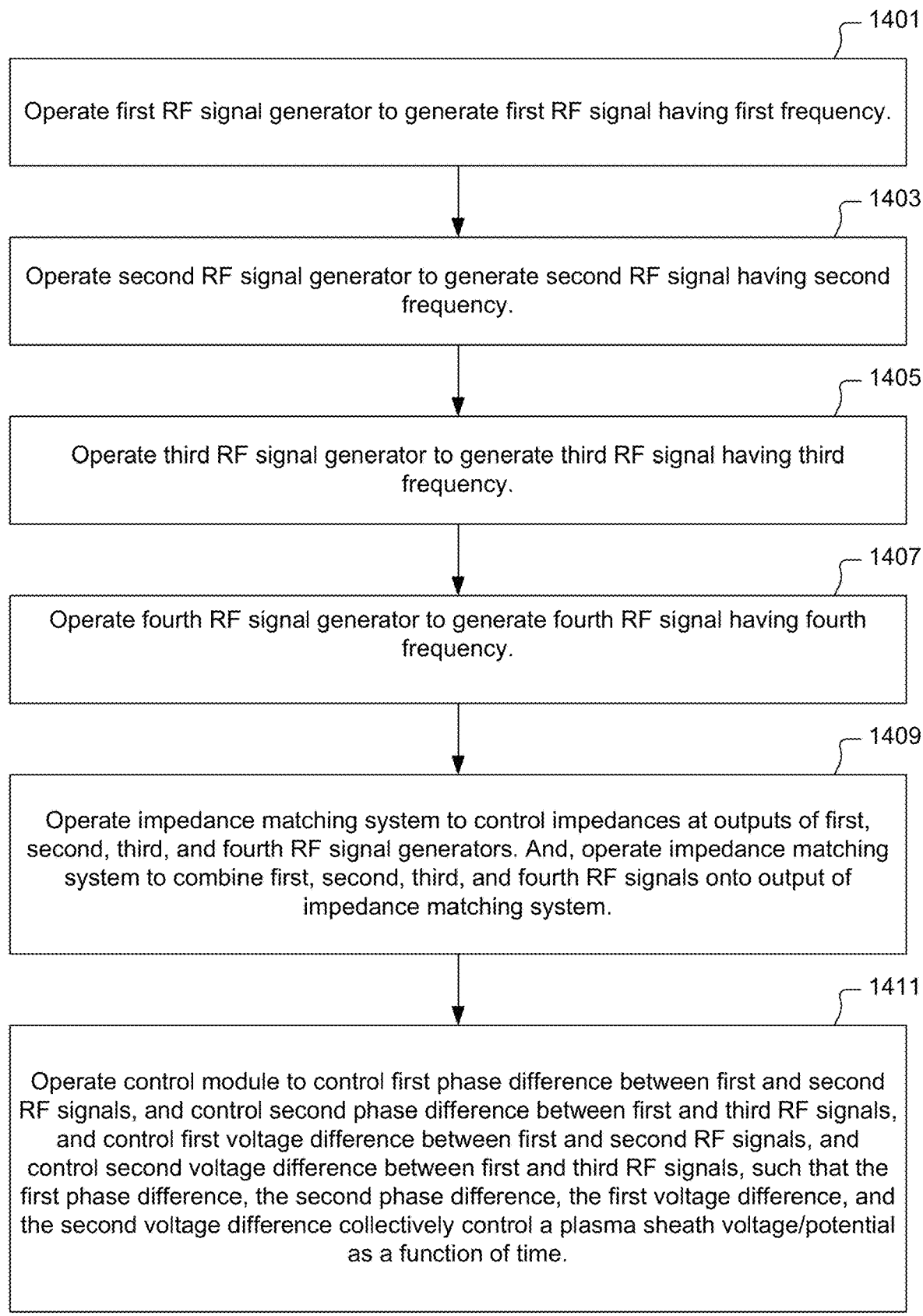
FIG. 14 shows a flowchart of a method for operating a radiofrequency signal generator system for a plasma processing system, in accordance with some embodiments.

FIG. 14 shows a flowchart of a method for operating a radiofrequency signal generator system for a plasma processing system, in accordance with some embodiments. It should be understood that the operations of FIG. 14 can be performed in a substantially simultaneous manner, although for description purposes some of the operations appear as though done in sequence within the flowchart of FIG. 14. The method includes an operation 1401 for operating a first RF signal generator (101) to generate a first RF signal having a first frequency ($LF_1$) at an output (110) of the first RF signal generator (101). The method also includes an operation 1403 for operating a second RF signal generator (1101-1) to generate a second RF signal having a second frequency ($LF_2$) at an output (1110-1) of the second RF signal generator (1101-2). The second frequency ($LF_2$) is a specified harmonic of the first frequency ($LF_1$), i.e., $LF_2$ z ($LF_1$*n), where n is an integer greater than 1. The method also includes an operation 1405 for operating a third RF signal generator (1101-2) to generate a third RF signal having a third frequency ($LF_3$) at an output (1110-2) of the third RF signal generator (1101-2). The third frequency ($LF_3$) is a specified harmonic of the first frequency ($LF_1$), i.e., $LF_3 \approx (LF_1$*n), where n is an integer greater than 1. The third frequency ($LF_3$) and the second frequency ($LF_2$) are different specified harmonics of the first frequency ($LF_1$). The method also includes an operation 1407 for operating a fourth RF signal generator (102) to generate a fourth RF signal having a fourth frequency (HF) at an output (171) of the fourth RF signal generator (102). The fourth frequency (HF) is at least two orders of magnitude larger than the first frequency ($LF_1$).

The method also includes an operation 1409 for operating an impedance matching system (1115) to control impedances at the output (110) of the first RF signal generator (101), and at the output (1110-1) of the second RF signal generator (1101-1), and at the output (1110-2) of the third RF signal generator (1101-2), and at the output (171) of the fourth RF signal generator (102). The first RF signal having the first frequency ($LF_1$), the second RF signal having the second frequency ($LF_2$), the third RF signal having the third frequency ($LF_3$), and the fourth RF signal having the fourth frequency (HF) are transmitted through the impedance matching system (1115) to a radiofrequency supply input (160) of the plasma processing system (150) causing generation of a plasma (1323) within the plasma processing system (150). The impedance matching system (1115) is operated to combine the first RF signal having the first frequency ($LF_1$), the second RF signal having the second frequency ($LF_2$), the third RF signal having the third frequency ($LF_3$), and the fourth RF signal having the fourth frequency ($LF_4$) onto the output of the impedance matching system (1115).

The method also includes an operation 1411 for operating a control module (163) to control a first phase difference ($\Delta\phi_1$) between the second RF signal having the second frequency ($LF_2$) and the first RF signal having the first frequency ($LF_1$). The operation 1411 also includes operating the control module (163) to control a second phase difference ($\Delta\phi_2$) between the third RF signal having the third frequency ($LF_3$) and the first RF signal having the first frequency ($LF_1$). The operation 1411 also includes operating the control module (163) to control a first voltage difference ($\Delta V_1$) between the second RF signal having the second frequency ($LF_2$) and the first RF signal having the first frequency ($LF_1$). The operation 1411 also includes operating the control module (163) to control a second voltage difference ($\Delta V_2$) between the third RF signal having the third frequency ($LF_3$) and the first RF signal having the first frequency ($LF_1$). The first phase difference ($\Delta\phi_1$), the second phase difference ($\Delta\phi_2$), the first voltage difference ($\Delta V_1$), and the second voltage difference ($\Delta V_2$) collectively control a plasma sheath voltage/potential as a function of time within the plasma processing system (150). In some embodiments, the plasma sheath voltage/potential is used to control a process result uniformity across a substrate (1305) within the plasma processing system (150).

In some embodiments of the method, the first frequency ($LF_1$) is within a range extending from about 340 kHz to about 440 kHz, and the fourth frequency (HF) is within a range extending from about 57 MHz to about 63 MHz, with each of the second frequency ($LF_2$) and third frequency ($LF_3$) being a respective integer multiple greater than one of the first frequency ($LF_1$). In some embodiments of the method, the first frequency ($LF_1$) is about 400 kHz, and the second frequency ($LF_2$) is about 1.2 MHz, and the third frequency ($LF_3$) is about 2.0 MHz, and the fourth frequency (HF) is about 60 MHz. In some embodiments of the method, the first phase difference ($\Delta\phi_1$) is about thirty degrees, and the second phase difference ($\Delta\phi_2$) is about thirty degrees. In some embodiments of the method, the first voltage difference ($\Delta V_1$) is controlled so that a power of the second RF signal having the second frequency ($LF_2$) is within a range extending from about 17% to about 20% of a power of the first RF signal having the frequency ($LF_1$), and the second voltage difference ($\Delta V_2$) is controlled so that a power of the third RF signal having the frequency ($LF_3$) is within a range extending from about 5% to about 8% of a power of the first RF signal having the frequency ($LF_1$).

In some embodiments of the method, the second RF signal generator (1101-1) is operated as a slave of the first RF signal generator (101) to cause the second frequency ($LF_2$) to track in real-time as an integer multiple of the first frequency ($LF_1$), and to cause the first phase difference ($\Delta\phi_1$) between the second RF signal having the second frequency ($LF_2$) and the first RF signal having the first frequency ($LF_1$) to be maintained in real-time. Also, in these embodiments of the method, the third RF signal generator (1101-2) is operated as a slave of the first RF signal generator (101) to cause the third frequency ($LF_3$) to track in real-time as an integer multiple of the first frequency ($LF_1$), and to cause the second phase difference ($\Delta\phi_2$) between the third RF signal having the third frequency ($LF_3$) and the first RF signal having the first frequency ($LF_1$) to be maintained in real-time.

In some embodiments, the first phase difference ($\Delta\phi_1$), and the second phase difference ($\Delta\phi_2$), and the first voltage difference ($\Delta V_1$), and the second voltage difference ($\Delta V_2$) are collectively set to control an etch rate uniformity across a substrate (1305) within the plasma processing system (150). In some embodiments, the first phase difference ($\Delta\phi_1$), and the second phase difference ($\Delta\phi_2$), and the first voltage difference ($\Delta V_1$), and the second voltage difference ($\Delta V_2$) are collectively set to increase a plasma sheath voltage/potential over a larger percentage of a cycle of the first RF signal having the first frequency ($LF_1$). In some embodiments, the first phase difference ($\Delta\phi_1$), and the first voltage difference ($\Delta V_1$), and the second phase difference ($\Delta\phi_2$), and the second voltage difference ($\Delta V_2$) are collectively controlled so that a combination of the first RF signal having the first frequency ($LF_1$), and the second RF signal having the second frequency ($LF_2$), and the third RF signal having the third frequency ($LF_3$) generates a substantially square cyclical waveform. In some embodiments, the first phase difference ($\Delta\phi_1$), and the first voltage difference ($\Delta V_1$), and the second phase difference ($\Delta\phi_2$), and the second voltage difference ($\Delta V_2$) are collectively controlled to provide a larger maximum plasma sheath voltage/potential than what is achievable from just the first RF signal having the first frequency ($LF_1$). In some embodiments, the first RF signal having the first frequency ($LF_1$), and the second RF signal having the second frequency ($LF_2$), and the third RF signal having the third frequency ($LF_3$) combine to form a cyclical waveform, where each cycle of the cyclical waveform has a negative half and a positive half, and where the first phase difference ($\Delta\phi_1$), and the first voltage difference ($\Delta V_1$), and the second phase difference ($\Delta\phi_2$), and the second voltage difference ($\Delta V_2$) are collectively controlled so that the negative half of each cycle of the cyclical waveform is longer than the positive half of each cycle of the cyclical waveform.

In the embodiments described above, multiple harmonic frequency signals are combined with a fundamental (base) frequency signal to create a composite low frequency RF signal waveform for use in the frequency tuning process of FIG. 2 in which a high frequency RF signal is applied in conjunction with the composite low frequency RF signal waveform to generate plasma for processing a semiconductor substrate. In some embodiments, either lieu of or in addition to, a passive approach can be implemented to manipulate one or more harmonic frequency signals of the fundamental (base) low frequency RF signal to create an engineered low frequency RF signal waveform for use in the frequency tuning process of FIG. 2. For example, in some embodiments of the passive approach, one or more RF signal filters can be disposed with various RF signal transmission paths within and/or around the plasma processing chamber 150 in order to manipulate one or more harmonic frequency signals of the fundamental (base) low frequency RF signal to create the engineered low frequency RF signal waveform for use in the frequency tuning process of FIG. 2. Also, in some embodiments, impedances of various chamber parts within the various RF signal transmission paths within and/or around the plasma processing chamber 150 can be engineered to contribute to manipulation of one or more harmonic frequency signals of the fundamental (base) low frequency RF signal to create the engineered low frequency RF signal waveform for use in the frequency tuning process of FIG. 2.

In some embodiments, the RF signal filters are configured to filter and/or change a phase of particular harmonic frequency signal relative to a phase of the fundamental (base) low frequency RF signal. In various embodiments, the RF signal filter can be implemented in either the low frequency RF signal generator 101 or the impedance matching system 115/1115. In the passive approach, the objective is to control a phase difference between one or more harmonic frequency signals and the corresponding fundamental (base) frequency signal in order to achieve a desired shape of the engineered low frequency RF signal waveform, and in turn achieve a desired plasma sheath voltage/potential behavior as a function of time that will have a beneficial effect on plasma process result uniformity control across the substrate. In the passive approach, impedance control is implemented within the RF transmission path(s) to affect phase control of the targeted low frequency harmonic signals and in turn achieve a desired shape of the engineered low frequency RF signal waveform. In some embodiments, the phase of particular low frequency harmonic signals can also be filtered/changed either electrically or by tuning some impedance along the RF signal transmission path, such as within the plasma processing chamber 1301/1351.

For example, an impedance control device, such as a variable capacitor or other device, is connected between an electrode and a reference ground potential in order to change the impedance to ground as seen by the particular harmonic frequency signals of the low frequency RF signal, which in turn changes the phase of the particular harmonic frequency signals and correspondingly changes the shape of the engineered low frequency RF signal waveform used in the frequency tuning process of FIG. 2. For example, with reference to FIG. 13A, in some embodiments a variable capacitor or other impedance control device is connected between the electrode 1315 and the reference ground potential 1308 in order to change the phase of one or more particular harmonic frequency signals and correspondingly change the shape of the engineered low frequency RF signal waveform used in the frequency tuning process of FIG. 2. It should be understood that in various embodiments, one or more impedance control devices can be installed at specified location(s) within the RF signal transmission path to achieve a desired effect on the phase(s) of one or more particular harmonic frequency signal(s) of the fundamental (base) low frequency RF signal as generated by the low frequency RF signal generator 101, in order to achieve a desired shape of the engineered low frequency RF signal waveform, and in turn achieve a desired plasma sheath voltage/potential behavior as a function of time that will have a beneficial effect on plasma process result uniformity control across the substrate.

It should be understood that the embodiments described herein can employ various computer-implemented operations involving data stored in computer systems. These operations are those requiring physical manipulation of physical quantities. Any of the operations described herein that form part of the embodiments are useful machine operations. The embodiments also relate to a hardware unit or an apparatus for performing these operations. The apparatus may be specially constructed for a special purpose computer. When defined as a special purpose computer, the computer can also perform other processing, program execution or routines that are not part of the special purpose, while still being capable of operating for the special purpose. In some embodiments, the operations may be processed by a general purpose computer selectively activated or configured by one or more computer programs stored in the computer memory, cache, or obtained over a network. When data is obtained over a network, the data may be processed by other computers on the network, e.g., a cloud of computing resources.

Various embodiments described herein can be fabricated as computer-readable code on a non-transitory computer-readable medium. The non-transitory computer-readable medium is any data storage hardware unit that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes, and other optical and non-optical data storage hardware units. The non-transitory computer-readable medium can include computer-readable tangible medium distributed over a network-coupled computer system so that the computer-readable code is stored and executed in a distributed fashion.

Although the foregoing disclosure includes some detail for purposes of clarity of understanding, it will be apparent that certain changes and modifications can be practiced within the scope of the appended claims. For example, it should be understood that one or more features from any embodiment disclosed herein may be combined with one or more features of any other embodiment disclosed herein. Accordingly, the present embodiments are to be considered as illustrative and not restrictive, and what is claimed is not to be limited to the details given herein, but may be modified within the scope and equivalents of the described embodiments.

What is claimed is:

1. A radiofrequency (RF) signal supply system for a plasma processing system, comprising:
    a first RF signal generator set to generate a first RF signal having a first frequency;
    a second RF signal generator set to generate a second RF signal having a second frequency, the second frequency being a specified harmonic of the first frequency;
    a third RF signal generator set to generate a third RF signal having a third frequency, the third frequency being a specified harmonic of the first frequency, the third frequency and the second frequency being different specified harmonics of the first frequency; and
    a fourth RF signal generator set to generate a fourth RF signal having a fourth frequency, the fourth frequency being at least two orders of magnitude larger than the first frequency.

2. The RF signal supply system for the plasma processing system as recited in claim 1, further comprising:
    an impedance matching system having a first input connected to an output of the first RF signal generator and a second input connected to an output of the second RF signal generator and a third input connected to an output of the third RF signal generator and a fourth input connected to an output of the fourth RF signal generator, the impedance matching system having an output connectable to an RF supply input of the plasma processing system, the impedance matching system configured to control impedances at the output of the first RF signal generator and at the output of the second RF signal generator and at the output of the third RF signal generator and at the output of the fourth RF signal generator; and
    a control module programmed to control:
    a first phase difference between the second RF signal and the first RF signal,
    a second phase difference between the third RF signal and the first RF signal,
    a first voltage difference between the second RF signal and the first RF signal, and
    a second voltage difference between the third RF signal and the first RF signal,
    the first phase difference, the second phase difference, the first voltage difference, and the second voltage difference collectively controlling a plasma sheath voltage as a function of time within the plasma processing system.

3. The RF signal supply system for the plasma processing system as recited in claim 2, wherein the plasma sheath voltage is used to control a process result uniformity across a substrate within the plasma processing system.

4. The RF signal supply system for the plasma processing system as recited in claim 1, wherein the first frequency is within a range extending from about 330 kiloHertz (kHz) to about 440 kHz, and the fourth frequency is within a range extending from about 54 megaHertz (MHz) to about 63 MHz.

5. The RF signal supply system for the plasma processing system as recited in claim 4, wherein the first frequency is about 400 kiloHertz (kHz), and the second frequency is about 1.2 megaHertz (MHz), and the third frequency is about 2.0 MHz, and the fourth frequency is about 60 MHz.

6. The RF signal supply system for the plasma processing system as recited in claim 2, wherein the first phase difference is about thirty degrees, and the second phase difference is about thirty degrees.

7. The RF signal supply system for the plasma processing system as recited in claim 2, wherein the first voltage difference is set so that a power of the second RF signal is within a range extending from about 17% to about 20% of a power of the first RF signal, and wherein the second voltage difference is set so that a power of the third RF signal is within a range extending from about 5% to about 8% of a power of the first RF signal.

8. The RF signal supply system for the plasma processing system as recited in claim 1, wherein each of the second frequency and third frequency is a respective integer multiple greater than one of the first frequency.

9. The RF signal supply system for the plasma processing system as recited in claim 1, wherein the second RF signal generator is connected as a slave of the first RF signal generator so that the second frequency tracks in real-time as an integer multiple of the first frequency, and so that a first phase difference between the second RF signal and the first RF signal is maintained in real-time, and
wherein the third RF signal generator is connected as a slave of the first RF signal generator so that the third frequency tracks in real-time as an integer multiple of the first frequency, and so that a second phase difference between the third RF signal and the first RF signal is maintained in real-time.

10. The RF signal supply system for the plasma processing system as recited in claim 2, wherein the first phase difference and the first voltage difference and the second phase difference and the second voltage difference are collectively set to control an etch rate uniformity across a substrate within the plasma processing system.

11. The RF signal supply system for the plasma processing system as recited in claim 2, wherein the first phase difference and the first voltage difference and the second phase difference and the second voltage difference are collectively set to increase a plasma sheath voltage over a larger percentage of a cycle of the first RF signal.

12. The RF signal supply system for the plasma processing system as recited in claim 2, wherein the first phase difference and the first voltage difference and the second phase difference and the second voltage difference are collectively set to generate a substantially square cyclical waveform as a combination of the first RF signal and the second RF signal and the third RF signal.

13. The RF signal supply system for the plasma processing system as recited in claim 2, wherein the first phase difference and the first voltage difference and the second phase difference and the second voltage difference are collectively set to provide a larger maximum plasma sheath voltage than what is achievable from just the first RF signal.

14. The RF signal supply system for the plasma processing system as recited in claim 2, wherein the first RF signal and the second RF signal and the third RF signal combine to form a cyclical waveform, each cycle of the cyclical waveform having a negative half and a positive half, wherein the first phase difference and the first voltage difference and the second phase difference and the second voltage difference are collectively set so that the negative half of each cycle of the cyclical waveform is longer than the positive half of each cycle of the cyclical waveform.

15. The RF signal supply system for the plasma processing system as recited in claim 2, wherein the impedance matching system includes a first impedance control circuit connected between the first input of the impedance matching system and the output of the impedance matching system, the impedance matching system including a second impedance control circuit connected between the second input of the impedance matching system and the output of the impedance matching system, the impedance matching system including a third impedance control circuit connected between the third input of the impedance matching system and the output of the impedance matching system, and the impedance matching system including a fourth impedance control circuit connected between the fourth input of the impedance matching system and the output of the impedance matching system.

16. A method for operating a radiofrequency signal supply system for a plasma processing system, comprising:
operating a first RF signal generator to generate a first RF signal having a first frequency at an output of the first RF signal generator;
operating a second RF signal generator to generate a second RF signal having a second frequency at an output of the second RF signal generator, the second frequency being a specified harmonic of the first frequency;
operating a third RF signal generator to generate a third RF signal having a third frequency at an output of the third RF signal generator, the third frequency being a specified harmonic of the first frequency, the third frequency and the second frequency being different specified harmonics of the first frequency;
operating a fourth RF signal generator to generate a fourth RF signal having a fourth frequency at an output of the fourth RF signal generator, the fourth frequency being at least two orders of magnitude larger than the first frequency;
operating an impedance matching system to control impedances at the output of the first RF signal generator and at the output of the second RF signal generator and at the output of the third RF signal generator and at the output of the fourth RF signal generator, wherein the first RF signal, the second RF signal, the third RF signal, and the fourth RF signal are transmitted through the impedance matching system to a radiofrequency supply input of the plasma processing system causing generation of a plasma within the plasma processing system;
operating a control module to control:
a first phase difference between the second RF signal and the first RF signal,
a second phase difference between the third RF signal and the first RF signal,
a first voltage difference between the second RF signal and the first RF signal, and
a second voltage difference between the third RF signal and the first RF signal,
wherein the first phase difference, the second phase difference, the first voltage difference, and the second voltage difference collectively control a plasma sheath voltage as a function of time within the plasma processing system.

17. The method as recited in claim 16, wherein the plasma sheath voltage is used to control a process result uniformity across a substrate within the plasma processing system.

18. The method as recited in claim 16, wherein the first frequency is within a range extending from about 330 kiloHertz (kHz) to about 440 kHz, and the fourth frequency is within a range extending from about 54 megaHertz (MHz) to about 63 MHz, and each of the second and third frequencies is a respective integer multiple greater than one of the first frequency.

19. The method as recited in claim 16, wherein the first frequency is about 400 kiloHertz (kHz), and the second frequency is about 1.2 megaHertz (MHz), and the third frequency is about 2.0 MHz, and the fourth frequency is about 60 MHz.

20. The method as recited in claim 19, wherein the first phase difference is about thirty degrees, and the second phase difference is about thirty degrees.

21. The method as recited in claim 19, wherein the first voltage difference is controlled so that a power of the second RF signal is within a range extending from about 17% to about 20% of a power of the first RF signal, and wherein the second voltage difference is controlled so that a power of the third RF signal is within a range extending from about 5% to about 8% of a power of the first RF signal.

22. The method as recited in claim 16, wherein the second RF signal generator is operated as a slave of the first RF signal generator to cause the second frequency to track in real-time as an integer multiple of the first frequency, and to cause the first phase difference to be maintained in real-time, and
wherein the third RF signal generator is operated as a slave of the first RF signal generator to cause the third frequency to track in real-time as an integer multiple of the first frequency, and to cause the second phase difference to be maintained in real-time.

23. The method as recited in claim 16, wherein the first phase difference, the second phase difference, the first voltage difference, and the second voltage difference are collectively controlled to control an etch rate uniformity across a substrate within the plasma processing system.

24. The method as recited in claim 16, wherein the first phase difference, the second phase difference, the first voltage difference, and the second voltage difference are collectively controlled to increase a plasma sheath voltage over a larger percentage of a cycle of the first RF signal.

25. The method as recited in claim 16, wherein the first phase difference and the first voltage difference and the second phase difference and the second voltage difference are collectively controlled so that a combination of the first RF signal and the second RF signal and the third RF signal generates a substantially square cyclical waveform.

26. The method as recited in claim 16, wherein the first phase difference and the first voltage difference and the second phase difference and the second voltage difference are collectively controlled to provide a larger maximum plasma sheath voltage than what is achievable from just the first RF signal.

27. The method as recited in claim 16, wherein the first RF signal and the second RF signal and the third RF signal combine to form a cyclical waveform, each cycle of the cyclical waveform having a negative half and a positive half, wherein the first phase difference and the first voltage difference and the second phase difference and the second voltage difference are collectively controlled so that the negative half of each cycle of the cyclical waveform is longer than the positive half of each cycle of the cyclical waveform.

28. The method as recited in claim 16, wherein the impedance matching system is operated to combine the first RF signal, the second RF signal, the third RF signal, and the fourth RF signal onto the output of the impedance matching system.

* * * * *